US008854890B1

(12) United States Patent
Miwa

(10) Patent No.: US 8,854,890 B1
(45) Date of Patent: Oct. 7, 2014

(54) PROGRAMMING TIME IMPROVEMENT FOR NON-VOLATILE MEMORY

(71) Applicant: SanDisk Technologies Inc., Plano, TX (US)

(72) Inventor: Hitoshi Miwa, Kanagawa (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/286,844

(22) Filed: May 23, 2014

Related U.S. Application Data

(63) Continuation of application No. 14/051,217, filed on Oct. 10, 2013.

(51) Int. Cl.
| G11C 16/04 | (2006.01) |
| G11C 16/24 | (2006.01) |
| G11C 16/12 | (2006.01) |
| G11C 16/10 | (2006.01) |

(52) U.S. Cl.
CPC ............ *G11C 16/0483* (2013.01); *G11C 16/24* (2013.01); *G11C 16/12* (2013.01); *G11C 16/10* (2013.01)
USPC ............ 365/185.18; 365/185.02; 365/185.28; 365/185.17

(58) Field of Classification Search
CPC .... G11C 16/0483; G11C 16/10; G11C 16/12; G11C 16/24
USPC ............................ 365/185.18, 185.02, 185.17
See application file for complete search history.

(56) References Cited

U.S. PATENT DOCUMENTS

| 5,812,457 | A | 9/1998 | Arase |
| 5,818,757 | A | 10/1998 | So et al. |
| 5,991,202 | A | 11/1999 | Derhacobian et al. |
| 6,469,933 | B2 | 10/2002 | Choi et al. |
| 7,272,039 | B2 | 9/2007 | Rudeck et al. |
| 7,304,894 | B2 | 12/2007 | Joo |
| 7,425,742 | B2 | 9/2008 | Nazarian |
| 7,433,241 | B2 | 10/2008 | Dong et al. |
| 7,450,430 | B2 * | 11/2008 | Hemink et al. .......... 365/185.25 |
| 7,463,531 | B2 | 12/2008 | Hemink et al. |
| 7,656,703 | B2 * | 2/2010 | Dong et al. .............. 365/185.02 |
| 7,864,585 | B2 * | 1/2011 | Tamada ................... 365/185.18 |

(Continued)

OTHER PUBLICATIONS

Office Action for U.S. Appl. No. 14/051,217 mailed Aug. 11, 2014.

*Primary Examiner* — Hoai V Ho
*Assistant Examiner* — Tri Hoang
(74) *Attorney, Agent, or Firm* — Vierra Magen Marcus LLP

(57) ABSTRACT

Disclosed herein are techniques for providing a programming voltage to a selected word line in a non-volatile memory array. This may be a 3D NAND, 2D NAND, or another type of memory array. The programming voltage may be quickly ramped up on the selected word line, without the need for adding a stronger charge pump to the memory device. The voltage on the selected word line may be ramped up to a target voltage during a channel pre-charge phase. The target voltage may be limited in magnitude so that program disturb does not occur. Next, during a channel boosting phase, the unselected word lines are increased to a boosting voltage. The voltage on the selected word line is also increased during the boosting phase to a second target level. Then, the voltage on the selected word line is charged up from the second target level to a program voltage.

20 Claims, 19 Drawing Sheets

(56) References Cited

U.S. PATENT DOCUMENTS

| | | | |
|---|---|---|---|
| 8,107,286 B2 * | 1/2012 | Itagaki et al. | 365/185.02 |
| 2010/0202210 A1 | 8/2010 | Aritome et al. | |
| 2011/0007562 A1 | 1/2011 | Yip | |
| 2011/0299331 A1 | 12/2011 | Kim | |
| 2012/0236647 A1 | 9/2012 | Pyeon et al. | |

* cited by examiner

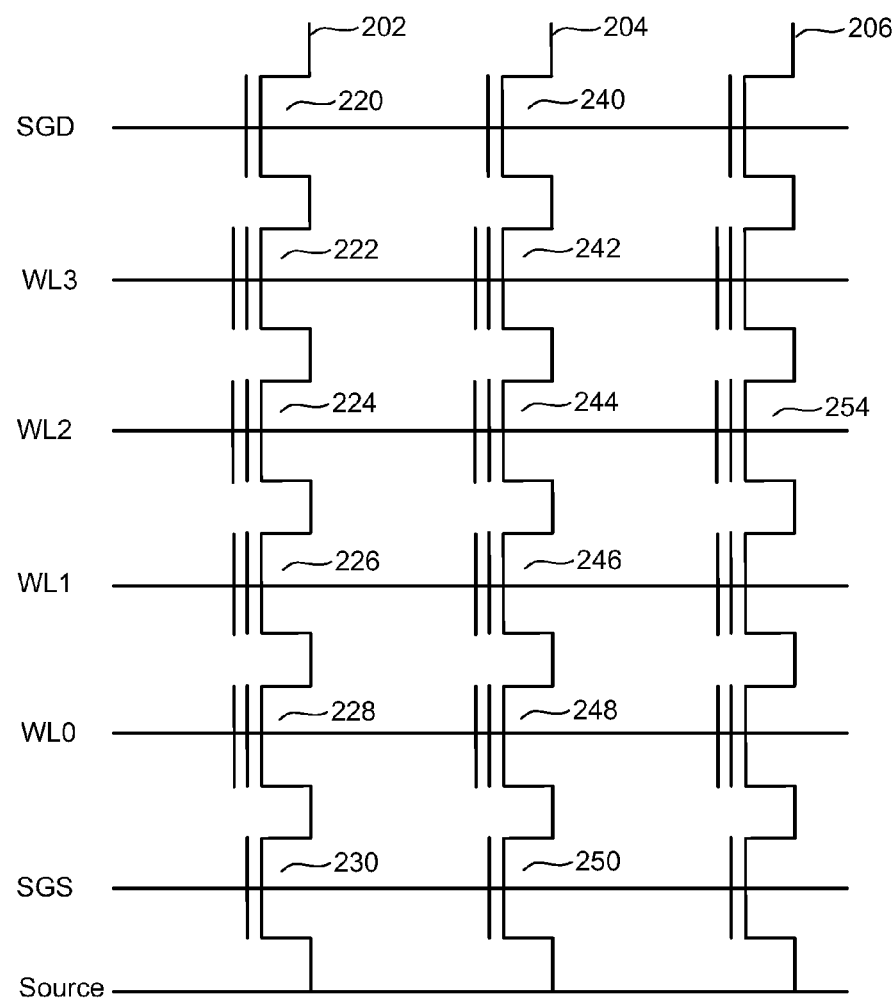

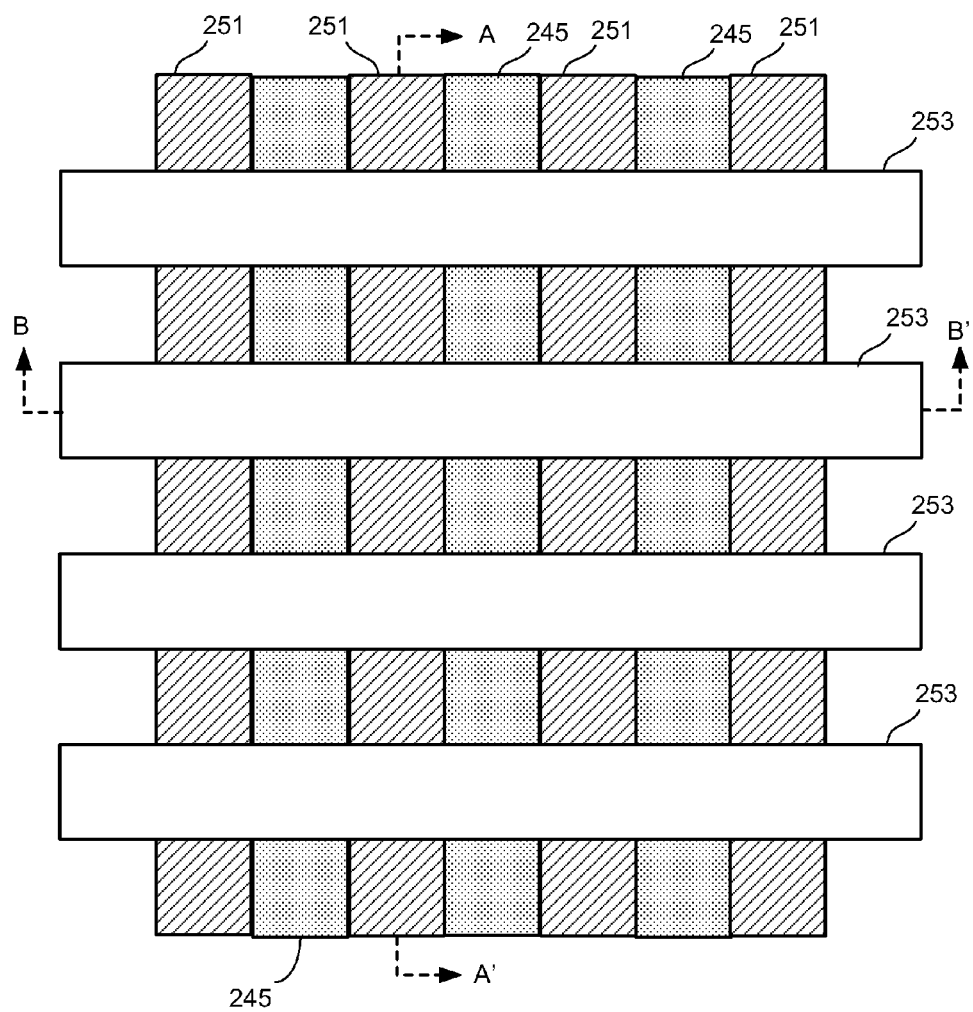

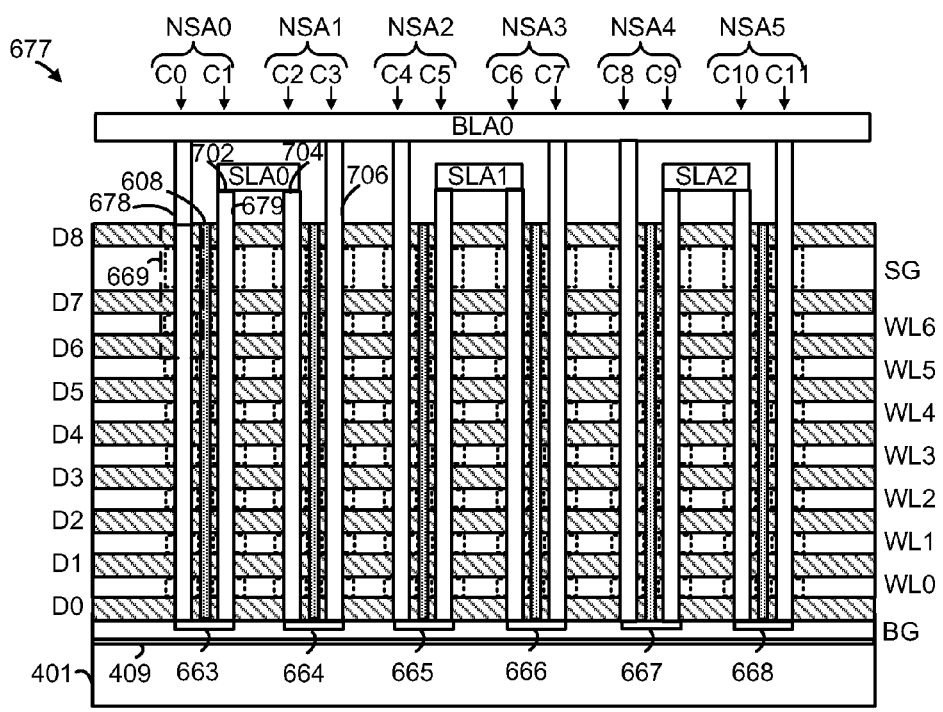

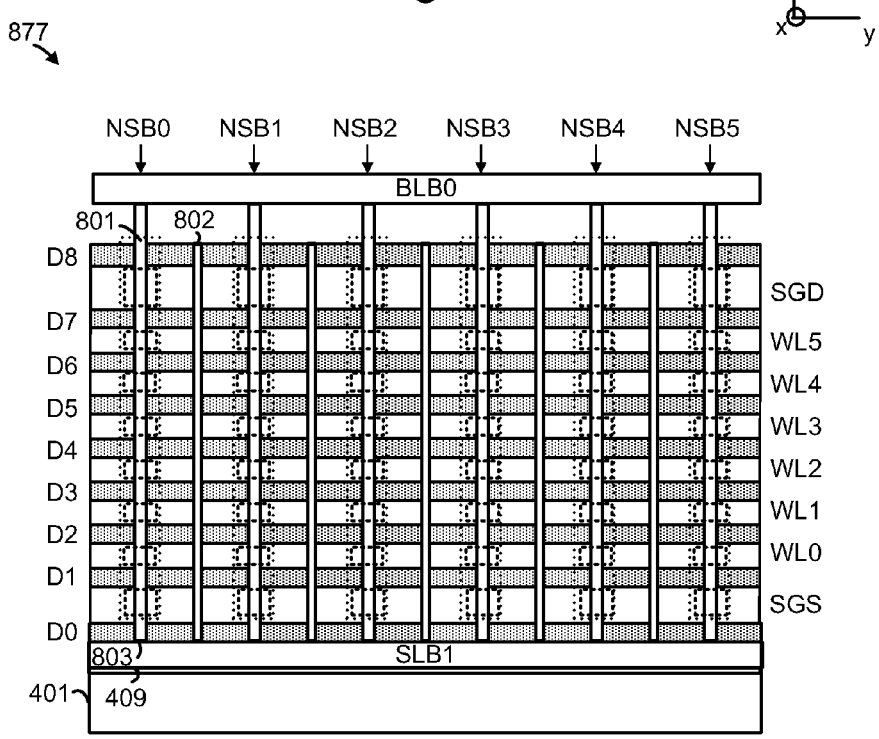

PROGRAMMING TIME IMPROVEMENT FOR NON-VOLATILE MEMORY

PRIORITY

This application is a continuation of and claims the benefit of U.S. application Ser. No. 14/051,217, entitled "Programming Time Improvement for Non-Volatile Memory," by Miwa, filed on Oct. 10, 2013, which is incorporated herein by reference.

BACKGROUND

The present disclosure relates to technology for non-volatile storage.

Semiconductor memory has become more popular for use in various electronic devices. For example, non-volatile semiconductor memory is used in personal navigation devices, cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some EEPROMs or flash memory devices have a configuration referred to as a NAND configuration in which memory cells are grouped as NAND strings with each NAND string associated with a bit line. One type of NAND memory array is a two-dimensional array. Another type of NAND memory array is a three-dimensional array. One 3D NAND stacked memory device is sometimes referred to as a Bit Cost Scalable (BiCS) architecture.

In a 3D NAND BiCS architecture, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. The pipe connection may be made of undoped polysilicon. A dielectric and back gate may surround the pipe connection forming a back gate transistor to control conduction of the pipe connection. Control gates of the memory cells are provided by the conductor layers.

Memory cells in some NAND architectures have a charge storage region that holds charge to program the memory cells. One example of a charge storage region is a floating gate. When programming an EEPROM or flash memory device, such as a NAND flash memory device, typically a program voltage is applied to the control gate (or selected word line) and the bit line is grounded. Electrons from the channel are injected into the charge storage region. When electrons accumulate in the charge storage region, the charge storage region becomes negatively charged and the threshold voltage of the memory cell is raised so that the memory cell is in a programmed state.

In many cases, the program voltage is applied to the control gate as a series of pulses (referred to as programming pulses), with the magnitude of the pulses increasing with each pulse. Between programming pulses, a set of one or more verify operations are performed to determine whether the memory cell(s) being programmed have reached their target level. If a memory cell has reached its target level, programming stops for that memory cell. If a memory cell has not reached its target level, programming will continue for that memory cell.

BRIEF DESCRIPTION OF THE DRAWINGS

Like-numbered elements refer to common components in the different figures.

FIG. 2A is a circuit diagram of three NAND strings with associated word lines.

FIG. 2B is a top view of the three NAND strings and word lines.

FIG. 7A depicts a cross-sectional view of a block of the 3D non-volatile memory device of FIG. 5A.

FIG. 7B depicts a cross-sectional view of a block of the 3D non-volatile memory device of FIG. 5B having straight strings.

DETAILED DESCRIPTION

Figure 1A:
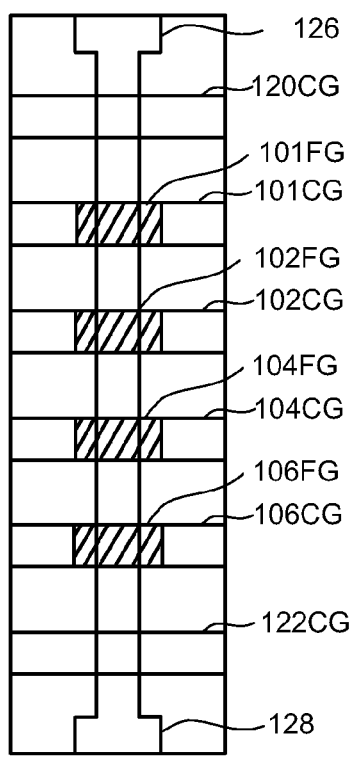
FIG. 1A is a top view of a NAND string.

A problem with programming non-volatile storage is the time it takes to raise the selected word line to the program voltage. Capacitive coupling between the selected word line and adjacent unselected word lines can slow the rate at which the voltage on the selected word line ramps up.

Furthermore, the capacitive coupling between word lines is larger for some architectures than for others. As one possibility, as the size of memory arrays continues to scale down, the capacitive coupling between adjacent word lines may increase. Another possibility is that a 3D architecture may have greater capacitance between word lines than a 2D architecture. This will be explained more fully below with reference to an example 3D architecture. Briefly, the area of the adjacent surfaces of word lines in a 3D architecture may be much greater than in a 2D architecture.

Also, note that the programming voltages may be larger for some architectures than for others. One possibility is that memory cells in a 3D BiCS architecture require a higher program voltage than memory cells in a 2D NAND. However, the programming voltage may depend on a variety of factors, and in some cases the programming voltage needed in one type of 2D NAND could be larger than another type of 2D NAND.

One possible solution to problems associated with charging word lines is to provide a stronger charge pump for delivering the program voltage. However, such a solution has drawbacks, such as requiring additional layout and consuming a larger peak current.

Disclosed herein are techniques for providing a programming voltage to a selected word line in a non-volatile memory array. This may be a 3D NAND, 2D NAND, or another type of memory array. The programming voltage may be quickly ramped up on the selected word line, without the need for adding a stronger charge pump to the memory device.

In one embodiment, selected and unselected word lines have a pre-charge voltage applied to them during a channel pre-charge phase. Then, the voltage on the selected word line is ramped up to a target voltage during the channel pre-charge phase while maintaining the pre-charge voltage on the unselected word lines. The target voltage applied to the selected word line may be limited in magnitude so that program disturb does not occur. On the other hand, the target voltage may be large enough to help speed the ramping up to a program voltage later on. Next, during a channel boosting phase, the unselected word lines are increased to a boosting voltage (e.g., $V_{PASS}$). The voltage on the selected word line is also increased during the boosting phase to a second target level. In one embodiment, the voltage is increased by floating the selected word line, while charging up unselected word lines to the boosting voltage. In another embodiment, the voltage is increased by (directly) charging up the selected word line using a charge pump. Then, the voltage on the selected word line is charged up from the second target level to a program voltage using a charge pump.

Note that the second target level on the selected word line may be relatively close (but typically below) the program voltage. Because the voltage on the selected word line only needs to be ramped up a small amount from the second target level to the program voltage, this can be achieved quickly and without resorting to stronger charge pumps. Further note that the charging of the selected word line to the first target level may take place during the pre-charge phase while other events are happening. This ramp up time may be effectively hidden within the pre-charge phase. Therefore, a stronger charge pump is not required to achieve the first target voltage. Also, the total programming time is not increased with such a technique, and may be decreased.

Also note that moving from the first target voltage to the second target voltage level on of the selected word line may take place during the boosting phase while the unselected word lines are being raised to the boosting voltage. Thus, this does not require a stronger charge pump to achieve. Further details are discussed below.

Example Memory System and Operation

One example of a memory system suitable for implementing embodiments uses a NAND flash memory architecture, which includes connecting multiple transistors in series between two select gates. Note that this could be a 2D NAND architecture or a 3D NAND architecture. Some examples are described herein of a 2D NAND architecture. Other examples described herein are of a 3D NAND architecture. Some embodiments described are applicable to either a 2D NAND architecture or a 3D NAND architecture.

Figure 1B:
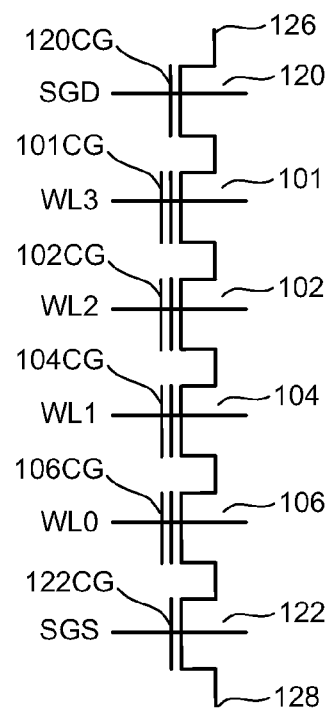
FIG. 1B is an equivalent circuit diagram of the NAND string of FIG. 1A.

The transistors connected in series and the select gates are referred to as a NAND string. FIG. 1A is a top view showing one NAND string. FIG. 1B is an equivalent circuit thereof. The NAND string includes four transistors, 101, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is) word line WL3, (where WL denotes "word line"), control gate 102CG is connected to WL2, control gate 104CG is connected to WL1, and control gate 106CG is connected to WL0. In one embodiment, transistors 100, 102, 104 and 106 are each storage elements, also referred to as memory cells. In other embodiments, the storage elements may include multiple transistors or may be different than depicted. Select gate 120 is connected to select line SGD. Select gate 122 is connected to select line SGS.

A typical architecture for a flash memory system using a NAND structure will include many NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

FIG. 2A shows three NAND strings 202, 204 and 206 of a memory array having many more NAND strings. Each of the NAND strings of FIG. 2A includes two select transistors and four memory cells. For example, NAND string 202 includes select transistors 220 and 230, and memory cells 222, 224, 226 and 228. NAND string 204 includes select transistors 240 and 250, and memory cells 242, 244, 246 and 248. Each NAND string is connected to the source line by its select transistor (e.g. select transistor 230 and select transistor 250). A selection line SGS is used to control the source side select gates. The various NAND strings are connected to respective bit lines by select transistors 220, 240, etc., which are controlled by select line SGD. In other embodiments, the select lines do not necessarily need to be in common. Word line WL3 is connected to the control gates for memory cell 222 and memory cell 242. Word line WL2 is connected to the control gates for memory cell 224, memory cell 244, and memory cell 252. Word line WL1 is connected to the control gates for memory cell 226 and memory cell 246. Word line WL0 is connected to the control gates for memory cell 228 and memory cell 248. As can be seen, each bit line and the respective NAND string comprises the columns of the array of memory cells. The word lines (WL3, WL2, WL1 and WL0) comprise the rows of the array.

FIG. 2B is a top view of a portion of an array of 2D NAND flash memory cells. The array includes bit lines 251 and word lines 253. Shallow trench isolation (STI) structures 245 are depicted between the bit lines 251 (note the bit lines are not at the same level as the STI structures 245). Note that FIG. 2B does not show all of the other details of the flash memory cells. Note that a NAND string can have fewer or more memory cells than depicted in FIGS. 2A and 2B. For example, some NAND strings will include eight memory cells, 16 memory cells, 32 memory cells, 64 memory cells, 128 memory cells, etc. The discussion herein is not limited to any particular number of memory cells in a NAND string. Furthermore, a wordline can have more or fewer memory cells than depicted in FIGS. 2A and 2B. For example, a wordline can include thousand or tens of thousands of memory cells. The discussion herein is not limited to any particular number of memory cells in a wordline.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the storage element depends upon the data encoding scheme adopted for the storage elements.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 224 of FIG. 2A, the program voltage will also be applied to the control gates of storage elements 244 and 254.

Figure 3:
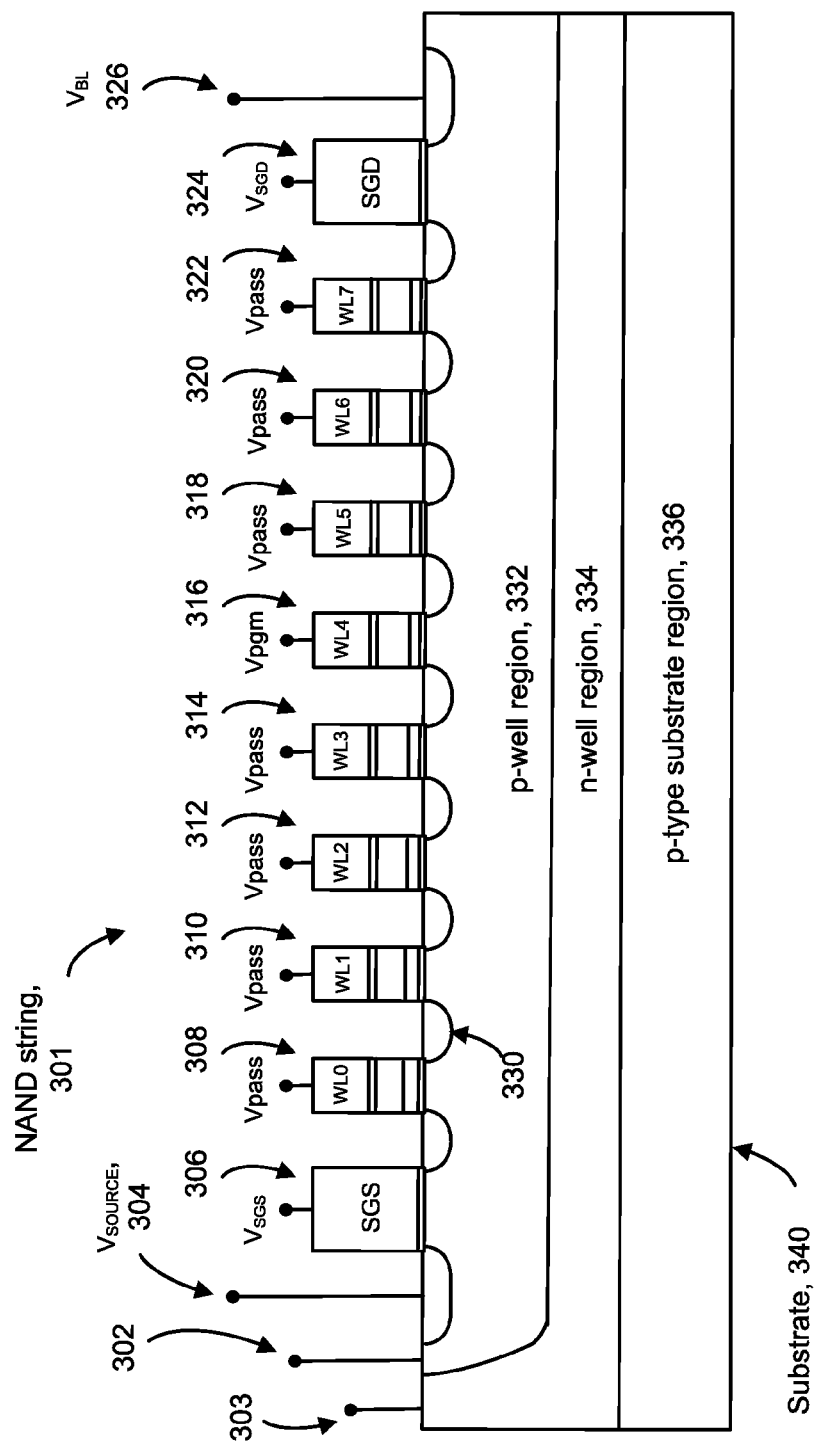
FIG. 3 depicts a cross-sectional view of a NAND string formed on a substrate.

FIG. 3 depicts a cross-sectional view of a 2D NAND string formed on a substrate. The view is simplified and not to scale. The 2D NAND string 301 includes a source-side select gate 306, a drain-side select gate 324, and eight storage elements 308, 310, 312, 314, 316, 318, 320 and 322, formed on a substrate 340. A number of source/drain regions, one example of which is source/drain region 330, are provided on either side of each storage element and the select gates 306 and 324.

In one approach, the substrate 340 employs a triple-well technology which includes a p-well region 332 within an n-well region 334, which in turn is within a p-type substrate region 336. The 2D NAND string and its non-volatile storage elements can be formed, at least in part, on the p-well region. A source supply line 304 with a potential of $V_{SOURCE}$ is provided in addition to a bit line 326 with a potential of $V_{BL}$. Voltages, such as body bias voltages, can also be applied to the p-well region 332 via a terminal 302 and/or to the n-well region 334 via a terminal 303. During a program operation, a program voltage $V_{PGM}$ is provided on a selected word line, in this example, WL4, which is associated with storage element 316. Further, recall that the control gate of a storage element may be provided as a portion of the word line. For example, WL0, WL1, WL2, WL3, WL4, WL5, WL6 and WL7 can extend via the control gates of storage elements 308, 310, 312, 314, 316, 318, 320 and 322, respectively. A pass or boosting voltage, $V_{PASS}$ is applied to the remaining unselected word lines associated with NAND string 301. $V_{SGS}$ and $V_{SGD}$ are applied to the select gates 306 and 324, respectively. Note that programming in a 3D NAND architecture has many similarities. However, the shape and orientation of the NAND string and word lines are different, as described below.

Example 3D Memory Device

The following discussion of an example 3D memory device is presented as one possible architecture in which embodiments may be practiced. These examples include a 3D NAND memory device. That is, the device includes NAND strings.

Figure 4:
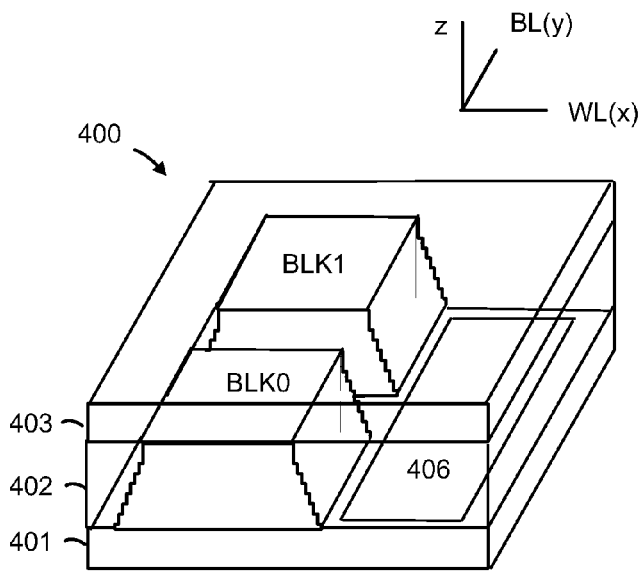
FIG. 4 is a perspective view of a 3D stacked non-volatile memory device.

FIG. 4 is a perspective view of a 3D stacked non-volatile memory device. The 3D memory device 100 includes a substrate 401. On the substrate are example blocks BLK0 and BLK1 of memory cells and a peripheral area 406 with circuitry for use by the blocks. The substrate 401 can also carry circuitry under the blocks, along with one or more lower metal layers which are patterned in conductive paths to carry signals of the circuitry. The blocks are formed in an intermediate region 402 of the memory device. In an upper region 403 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

Figure 5A:
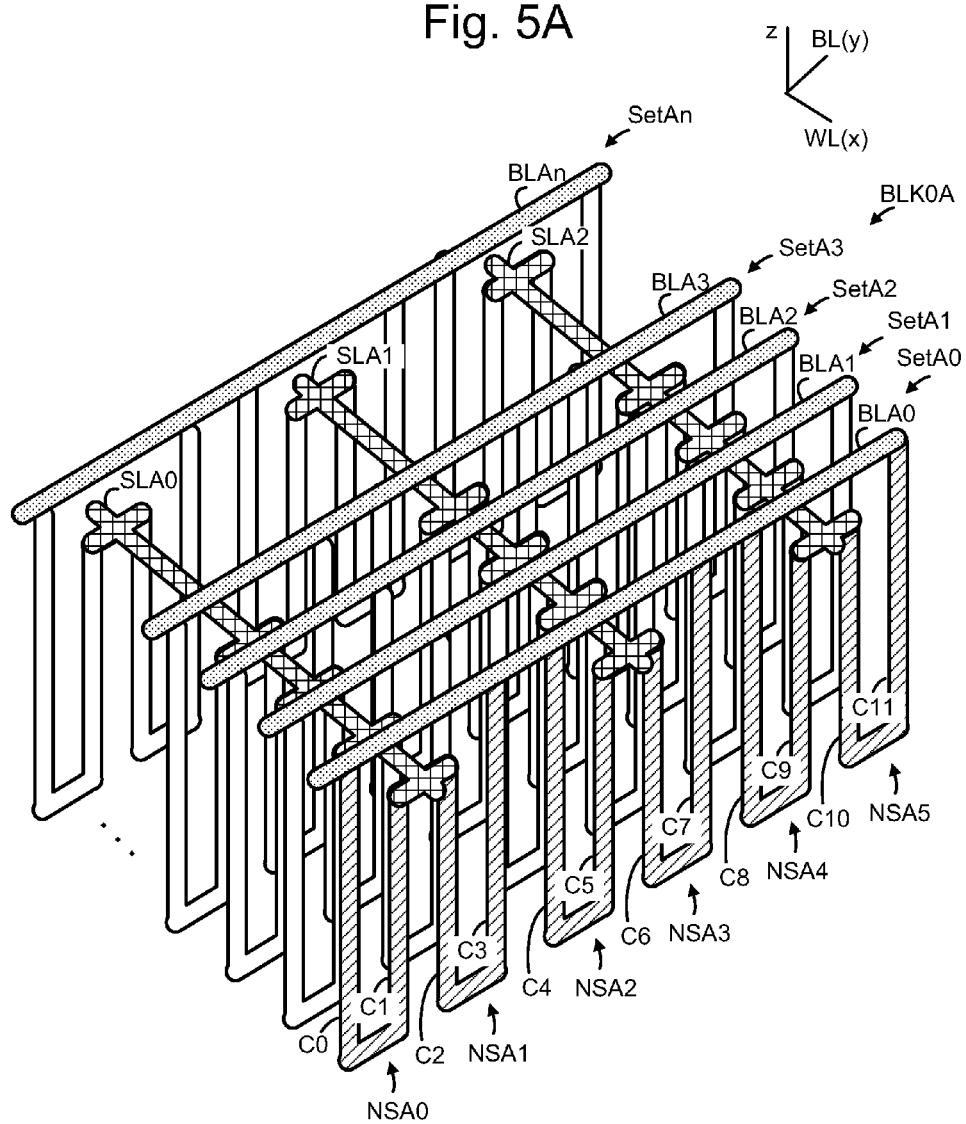
FIG. 5A depicts an embodiment of block BLK0 of FIG. 4 which includes U-shaped NAND strings.

FIG. 5A depicts an embodiment of block BLK0 of FIG. 4 which includes U-shaped NAND strings. The block BLK0A includes U-shaped NAND strings arranged in sets (SetA0, SetA0, SetA2, SetAn, where there are n−1 sets in a block). Each set of NAND strings is associated with one bit line (BLA0, BLA1, BLA2, BLA3, BLAn). In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 5B:
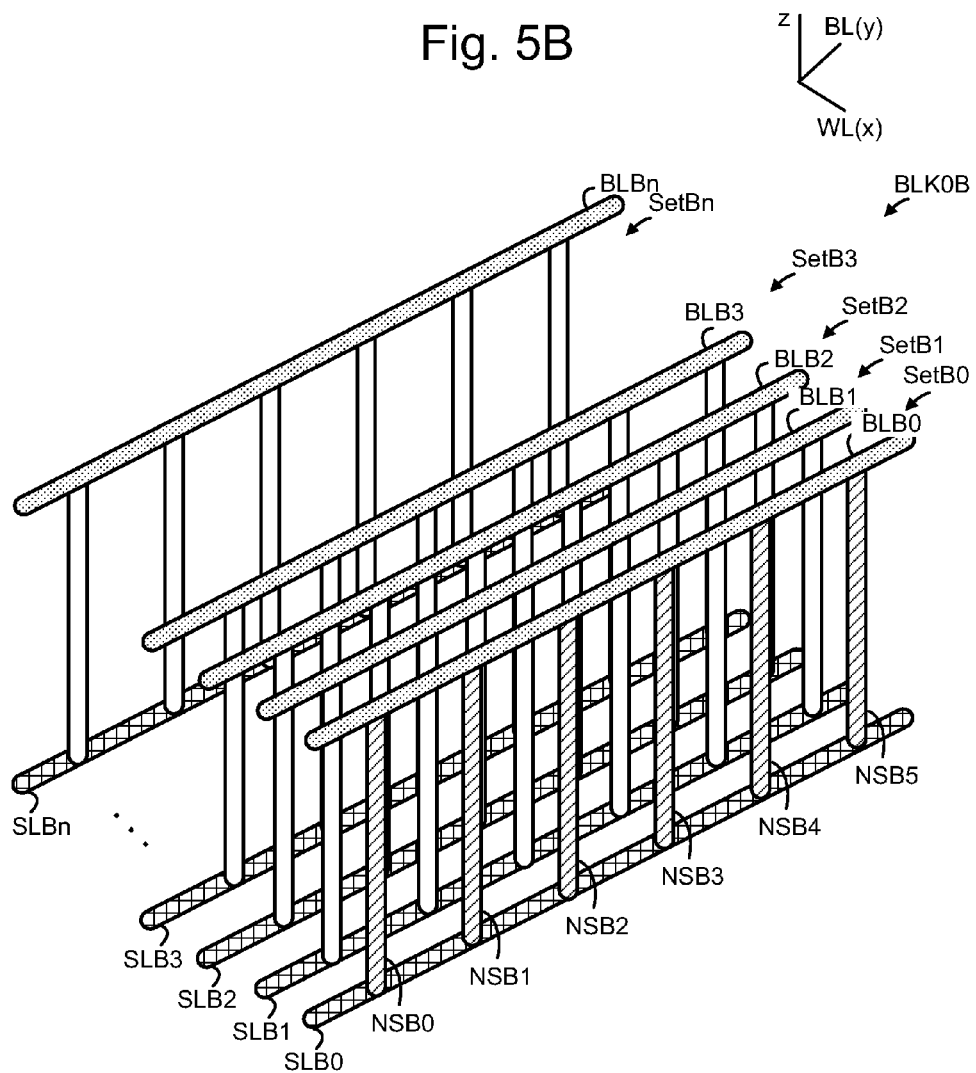
FIG. 5B depicts an embodiment of block BLK0 of FIG. 4 which includes straight NAND strings.

FIG. 5B depicts an embodiment of block BLK0 of FIG. 4 which includes straight NAND strings. The block BLK0B includes straight NAND strings arranged in sets (SetB0, SetB1, SetB2, SetB3, . . . , SetBn, where there are n−1 sets in a block). Each set of NAND strings is associated with one bit line (BLB0, BLB1, BLB2, BLB3, BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB 1, SLB2, SLB3, . . . , SLBn. In one approach, the source lines in a block are joined to one another and driven by one driver. The bit lines are above the memory cell array and the source lines are below the memory cell array in this example.

Figure 6A:
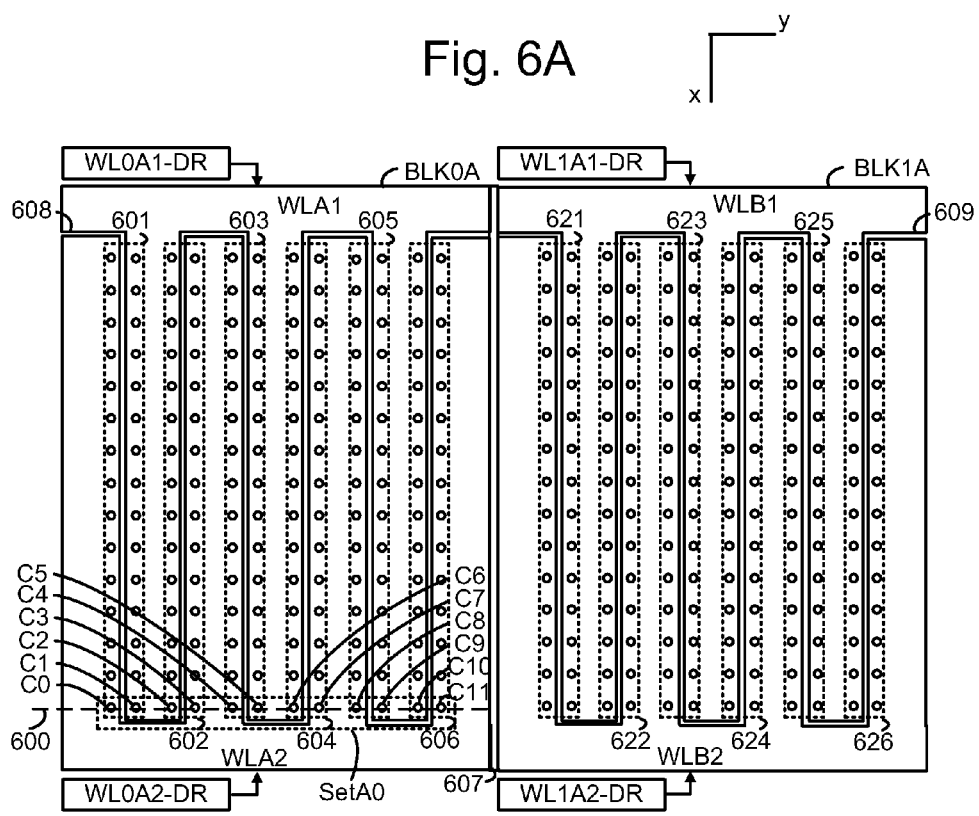
FIG. 6A depicts a top view of a word line layer of a 3D non-volatile memory device having U-shaped NAND strings.

FIG. 6A depicts a top view of a word line layer of a 3D non-volatile memory device 400 having U-shaped NAND strings, consistent with FIG. 5A, showing word line layer portions and associated drivers. This is a representative layer among the multiple word line layers in a stack. Referring also to FIG. 7A, the stack includes alternating dielectric and conductive layers. The dielectric layers include D0 to D8 and may be made of $SiO_2$, for instance. The conductive layers include BG, which is a back gate layer, WL0 to WL6, which form word line layers, e.g., conductive paths to control gates of the memory cells at the layer, and SG, which forms a select gate layer, e.g., a conductive path to control gates of select gates of NAND strings. The word line layer of FIG. 6A may represent any one of WL0 to WL6, for instance. The conductive layers may include doped polysilicon or metal silicide, for instance. An example voltage of 5-10 V may be applied to the back gate to maintain a conductive state which connects the drain- and source-side columns.

FIG. 6A depicts the block BLK0A of FIG. 4 and a similar block BLK1A as an example. For each block, the word line layer is divided into two word line layer portions, e.g., word line layer portions WLA1 and WLA2 in BLK0A, and word line layer portions WLB1 and WLB2 in BLK1A. Each block includes a slit pattern. A slit refers, e.g., to a void which extends vertically in the stack, typically from an etch stop layer at the bottom to at least a top layer of the stack. The slit can be filled with insulation to insulate words line layer portions from one another. A slit 608 of BLK0A is a single continuous slit which extends in a zig-zag pattern in the block so that the block is divided into two portions, WLA1 and WLA2, which are insulated from one another. Similarly, a slit 609 of BLK1A divides BLK1A into two portions, WLB1 and WLB2, which are insulated from one another. This approach can provide greater flexibility in controlling the memory cells since the word line layer portions can be drive independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells in BLK0A along a line 600 include C0 to C11. The figure represents a simplification, as many more rows of memory holes will typically be used, extending to the right and left in the figure. Also, the figures are not necessarily to scale. The columns of memory cells can be arranged in sub-blocks 601 to 606 in BLK0A and 621 to 626 in BLK1A. When U-shaped NAND strings are used, each sub-block can include two adjacent rows of columns of memory cells. In a sub-block, the adjacent rows are separated by the slit. The columns of memory cells on one side of the slit are drain-side columns (e.g., C0, C3, C4, C7, C8 and C11 in FIG. 5A), and the columns of memory cells on the other side of the slit are source-side columns (e.g., C1, C2, C5, C6, C9 and C10 in FIG. 5A). Note that the pattern of two source-side columns between two drain-side columns repeats in the y-direction.

Word line drivers WL0A1-DR, WL0A2-DR, WL1A1-DR and WL1A2-DR independently provide signals such as voltage waveforms to the word line layer portions WLA1, WLA2, WLB1 and WLB2, respectively.

The drawings are not to scale and do not show all memory columns. For example, a more realistic block might have 12 memory columns in the y direction as shown, but a very large number such as 32 k memory columns in the x direction, for a total of 384 k memory columns in a block. With U-shaped NAND strings, this is 192K NAND strings. With straight NAND strings, this is 384 k NAND strings.

Figure 6B:
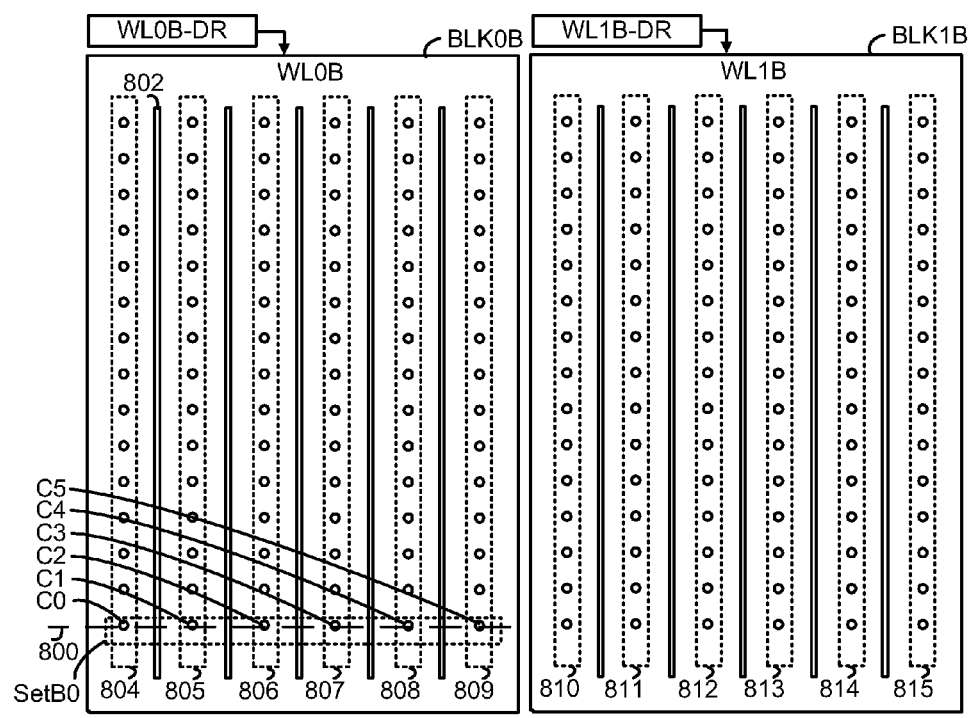
FIG. 6B depicts a top view of word line layers of a 3D non-volatile memory device having straight NAND strings.

FIG. 6B depicts a top view of word line layers of a 3D non-volatile memory device 400 having straight NAND strings, consistent with FIG. 5B, showing associated drivers. In this configuration, a NAND string has only one column, and the source-side select gate is on the bottom of the column instead of on the top, as in a U-shaped NAND string. Moreover, a given level of a block has one word line layer which is connected to each of the memory cells of the layer. For example, BLK0B has word line layer WL0B, driven by WL0B-DR, and BLK1B has word line layer WL1B, driven by WLB1-DR. A number of slits, such as example slit 802, can also be used. These insulation-filled slits are used in the fabrication process to provide structural support for the stack when undoped polysilicon layers are removed by a wet etch and a dielectric is deposited to form the alternating dielectric layers.

A dashed line 800 extends through columns C0 to C6, shown in cross-section in FIG. 7B. Each block can include sub-blocks of columns of memory cells, such as sub-blocks 804 to 809 in BLK0B and sub-blocks 810 to 815 in BLK1B.

FIG. 7A depicts a cross-sectional view of a block of the 3D non-volatile memory device of FIG. 5A, along line 600 of SetA0 of NAND strings of FIG. 5A. Columns of memory cells C0 to C11 are depicted in the multi-layer stack. The stack 677 includes the substrate 401, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 663 to 668 which connect the columns. The back gate thus connects the two columns of each U-shaped NAND string. For example, NSA0 includes columns C0 and C1 and connecting portion 663. NSA0 has a drain end 678 and a source end 702. NSA1 includes columns C2 and C3 and connecting portion 664. NSA1 has a drain end 706 and a source end 704. NSA2 includes columns C4 and C5 and connecting portion 665. NSA3 includes columns C6 and C7 and connecting portion 666. NSA4 includes columns C8 and C9 and connecting portion 667. NSA5 includes columns C10 and C11 and connecting portion 668.

The source line SLA0 is connected to the source ends 702 and 704 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 677 extend behind the U-shaped NAND strings depicted in the cross-section, e.g., along the x-axis. The U-shaped NAND strings NSA0 to NSA5 are each in a different sub-block, but are in a common set of NAND strings (SetA0).

The slit portion 608 from FIG. 6A is also depicted as an example. In the cross-section, multiple slit portions are seen, where each slit portion is between the drain- and source-side columns of a U-shaped NAND string. Portions of the source lines SLA0, SLA1, SLA2 are also depicted. A portion of the bit line BLA0 is also depicted.

Short dashed lines depict memory cells and select gates, as discussed further below.

FIG. 7B depicts a cross-sectional view of a block of the 3D non-volatile memory device of FIG. 5B having straight strings. The view is along line 800 of setB0 of NAND strings of FIG. 6B. Columns of memory cells corresponding to NAND strings NSB0 to NSB5, respectively, are depicted in the multi-layer stack. The stack 877 includes a substrate 401, an insulating film 409 on the substrate, and a portion of a source line SLB1. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 803 and a drain end 801. The slit 802 from FIG. 6B is also depicted with other slits. A portion of the bit line BLB0 is also depicted. Dashed lines depict memory cells and select gates, as discussed further below.

Referring again to FIGS. 6A and 6B, the word line layers may have a relatively large area. Referring again to FIGS. 7A and 7B, a word line layer at, for example, WL4, will have a word line layer above and below it in the stack. Thus, the surface area of neighboring word line layers can be relatively large, leading to substantial capacitive coupling. Embodiments provide techniques for rapidly ramping up to the program voltage on a selected word line. Moreover, embodiments do not require large charge pumps to achieve this rapid ramp-up.

Figure 8A:
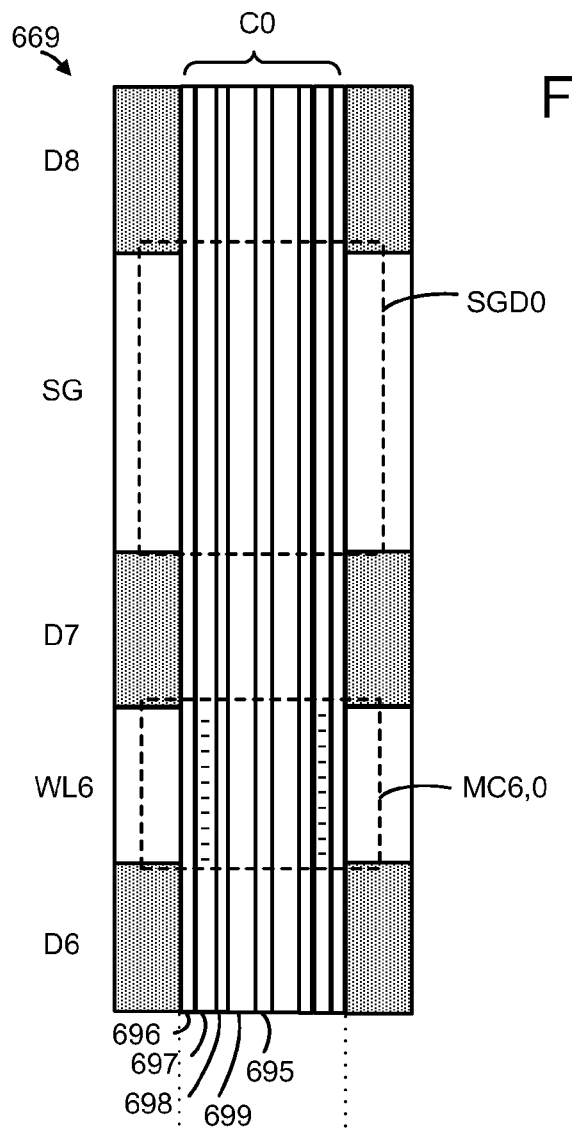
FIG. 8A depicts a close-up view of the region 669 of the column C0 of FIG. 7A.
Figure 8B:
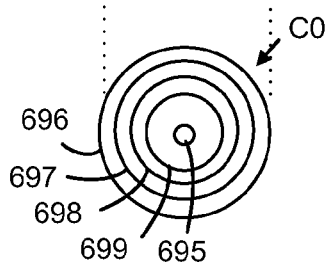
FIG. 8B depicts a cross-sectional view of the column C0 of FIG. 8A.

A region 669 of the stack is shown in greater detail in FIG. 8A. FIG. 8A depicts a close-up view of the region 669 of the column C0 of FIG. 7A, showing a drain-side select gate SGD0 and a memory cell MC6,0. FIG. 8B depicts a cross-sectional view of the column C0 of FIG. 8A. Each layer is ring-shaped in one possible approach, except the core filler which is cylindrical.

The region shows portions of the dielectric layers D6 to D8 and the conductive layers WL6 and SG. Each column includes a number of layers which are deposited along the sidewalls of the column. These layers can include oxide-nitride-oxide and polysilicon layers which are deposited, e.g., using atomic layer deposition. For example, a block oxide can be deposited as layer 696, a nitride such as SiN as a charge trapping layer can be deposited as layer 697, a tunnel oxide can be deposited as layer 698, a polysilicon body or channel can be deposited as layer 699, and a core filler dielectric can be deposited as region 695. Additional memory cells are similarly formed throughout the columns.

When a memory cell is programmed, electrons are stored in a portion of the charge trapping layer which is associated with the memory cell. For example, electrons are represented by "−" symbols in the charge trapping layer 697 for MC6,0. These electrons are drawn into the charge trapping layer from the polysilicon body, and through the tunnel oxide. The threshold voltage of a memory cell is increased in proportion to the amount of stored charge.

Figure 9A:
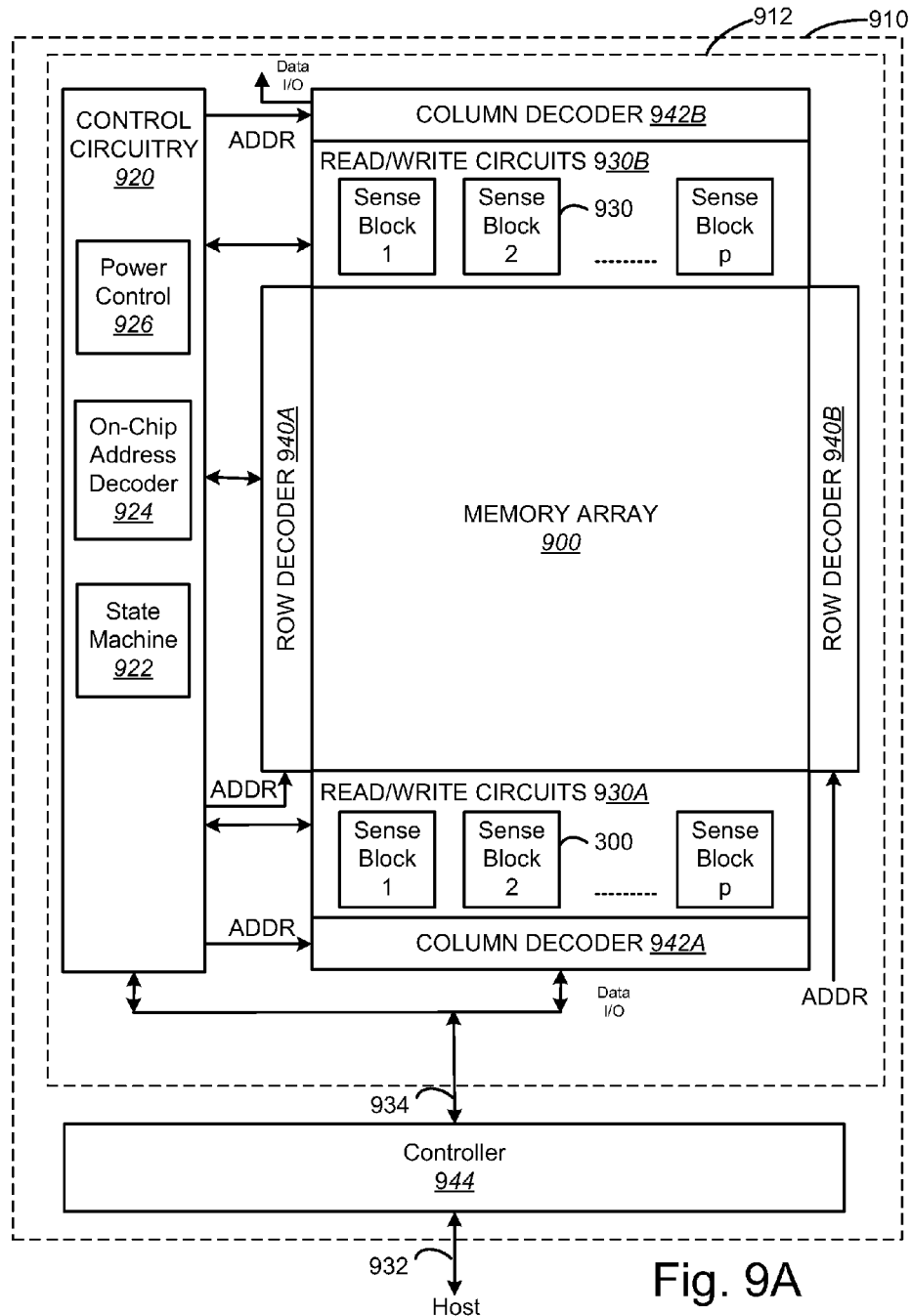
FIG. 9A illustrates a non-volatile storage device that may include one or more memory die or chips.

FIG. 9A illustrates a non-volatile storage device 910 that may include one or more memory die or chips 912. Memory die 912 includes an array (two-dimensional or three dimensional) of memory cells 900, control circuitry 920, and read/write circuits 930A and 930B. In one embodiment, the memory cells 900 have a 3D NAND configuration. In one embodiment, the memory cells 900 have a 2D NAND configuration.

In one embodiment, access to the memory array 900 by the various peripheral circuits is implemented in a symmetric fashion, on opposite sides of the array, so that the densities of access lines and circuitry on each side are reduced by half. The read/write circuits 930A and 930B include multiple sense blocks 930 which allow a page of memory cells to be read or programmed in parallel. The memory array 900 is addressable by word lines via row decoders 940A and 940B and by bit lines via column decoders 942A and 942B. In a typical embodiment, a controller 944 is included in the same memory device 910 (e.g., a removable storage card or package) as the one or more memory die 912. Commands and data are transferred between the host and controller 944 via lines 932 and between the controller and the one or more memory die 912 via lines 934. One implementation can include multiple chips 912.

Control circuitry 920 cooperates with the read/write circuits 930A and 930B to perform memory operations on the memory array 900. The control circuitry 920 includes a state machine 922, an on-chip address decoder 924 and a power control module 926. The state machine 922 provides chip-level control of memory operations. The on-chip address decoder 924 provides an address interface to convert between the address that is used by the host or a memory controller to the hardware address used by the decoders 940A, 940B, 942A, and 942B. The power control module 926 controls the power and voltages supplied to the word lines and bit lines during memory operations. In one embodiment, power control module 926 includes one or more charge pumps that can create voltages larger than the supply voltage.

In one embodiment, one or any combination of control circuitry 920, power control circuit 926, decoder circuit 924, state machine circuit 922, decoder circuit 942A, decoder circuit 942B, decoder circuit 940A, decoder circuit 940B, read/write circuits 930A, read/write circuits 930B, and/or controller 944 can be referred to as one or more managing circuits.

Figure 9B:
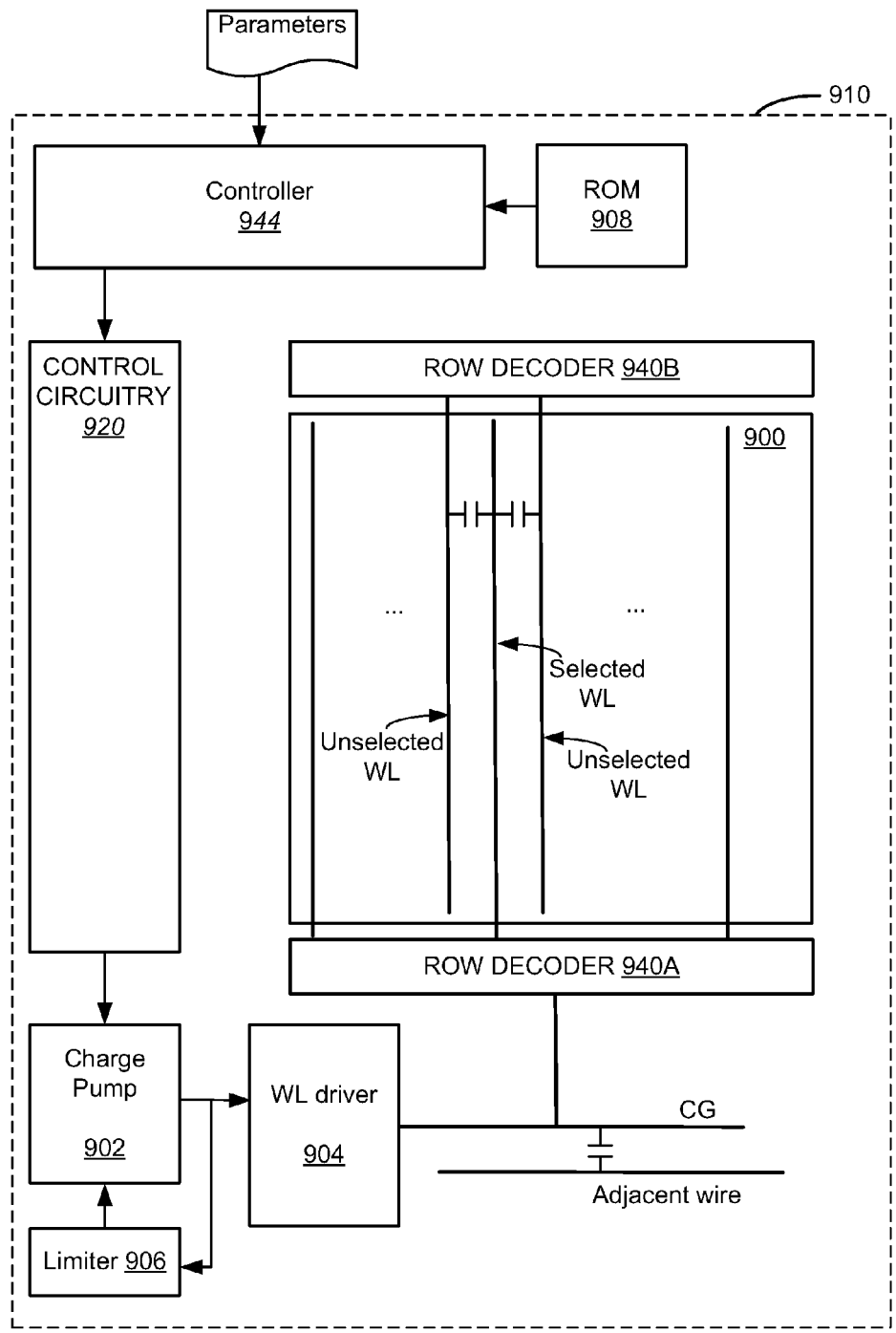
FIG. 9B illustrates a non-volatile storage device that may include one or more memory die or chips.

FIG. 9B illustrates one embodiment of a non-volatile storage device 910. This device may also include one or more memory die or chips, although for convenience these are not depicted. In one embodiment, the word lines are in a 3D memory array. In one embodiment, the word lines are in a 2D memory array. Numerous examples of 2D NAND and 3D NAND described herein may be used in the memory array 900, although the memory array 900 is not limited to these examples. A few word lines associated with the memory array 900 are depicted. Although the word lines are represented by lines in FIG. 9B, it will be understood that the word lines may be shaped more like plates. For example, the word lines in FIGS. 6A, 6B, 7A, and 7B may be described as plate shaped.

The capacitors that are depicted between the selected word line and its two neighboring (adjacent) unselected word lines represent capacitive coupling between the word lines. This may be referred to a "parasitic" capacitive coupling.

This diagram shows a charge pump 902 providing voltages to the memory array 900. The charge pump 902 provides voltages to a word line (WL) driver 904, which provides the voltages to the row decoder 940A. The row decoder 940A drives a set of the word lines. The other row decoder 940B drives another set of the word lines. A similar (or the same) charge pump may provide voltages to the other row decoder 940B.

The limiter 906 samples the voltage provided by the charge pump 902 and limits the voltage by providing a feedback signal to the charge pump 902. The limiter 906 is not required, as other techniques could be used to limit the voltage.

The ROM 908 contains various device parameters, in one embodiment. These device parameters may include parameters to help the controller 944 (or other logic) to determine suitable voltages to apply to the selected word line during programming. These parameters can include values that either specify the capacitive coupling between word lines or can be used to calculate the capacitive coupling between word lines. Note that this calculation may be an estimate of the capacitive coupling. In one embodiment, the controller 944 determines a worst case capacitive coupling. The worst case capacitive coupling could be a maximum expected capacitive coupling given various factors such as process variations and operational conditions. Further details are discussed with respect to FIG. 14A.

The parameters in the ROM 908 can include either the minimum expected voltage in the channel of unselected NAND strings during the pre-charge phase or values that can be used to determine said voltage. The parameters in the ROM 908 can include either maximum acceptable voltage between the NAND channel and the word line factoring in program disturb or values to determine said maximum acceptable voltage. Further details of using such parameters to calculate voltages for the selected word line during programming are discussed with respect to FIG. 14A.

Note that it is not required that the parameters be stored in the ROM 908. The parameters could be stored elsewhere on the memory device 910, such as in a spare memory region of the memory array 900. In one embodiment, the parameters for determining selected word line voltages during programming are provided to the controller 944 from outside of the memory device 910. As one alternative, logic outside of the memory device 910 could determine suitable voltages and provide the values for the voltages directly to the controller 944.

Figure 10:
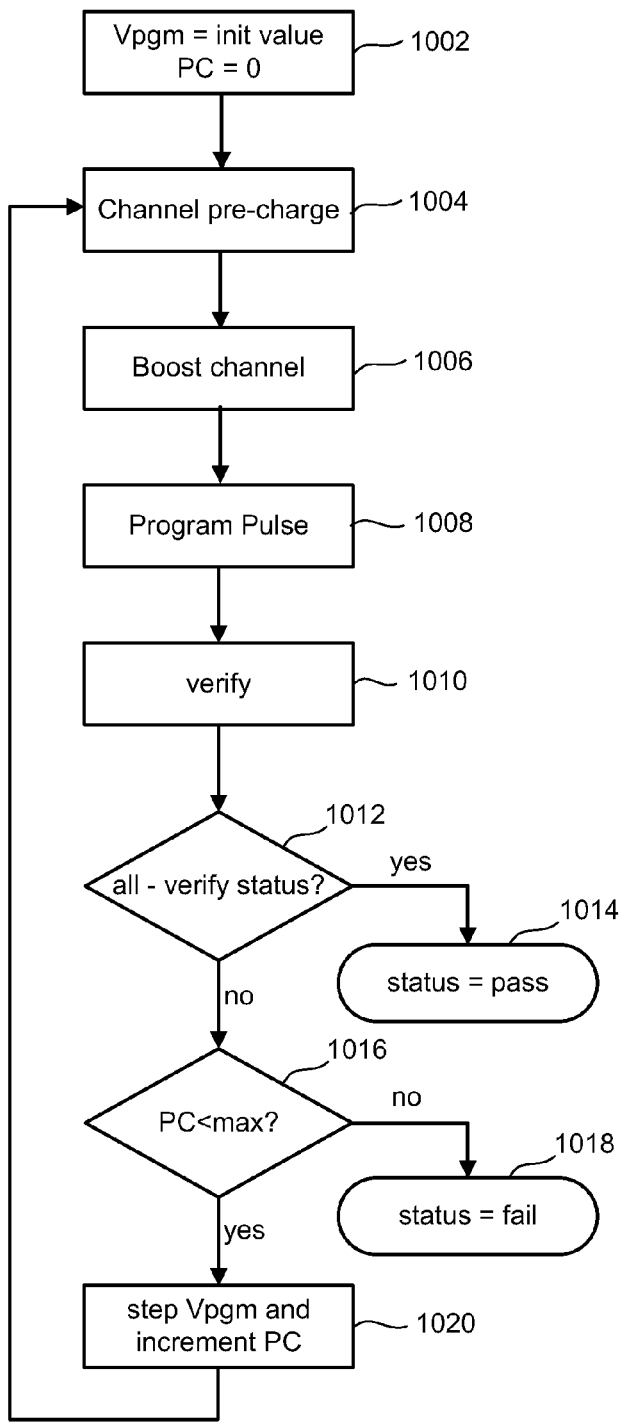
FIG. 10 is a flowchart describing one embodiment of a programming process.

FIG. 10 is a flowchart describing one embodiment of a programming process. In step 1002, the program voltage ($V_{PGM}$) is set to an initial value. This is the program voltage that will be applied to the selected word line for the first iteration of the process. This program voltage will be stepped up during the process. Also, in step 1002, a program counter (PC) is initialized to zero. The program counter tracks how many program pulses have been applied, such that programming can be aborted if the memory cell does not program within an allowed number of program pulses.

In step 1004, channels of NAND strings are pre-charged. This is referred to herein as a pre-charge phase. Further details are shown and described with respect to FIGS. 12A, 12B and 13.

In step 1006, channels of unselected NAND strings are boosted. An unselected NAND string is one that does not have a memory cell being programmed. That is, the program pulse to be applied should not program any memory cells on an unselected NAND string. Boosting the channels of unselected NAND strings helps to prevent program disturb.

In step 1008, a program pulse is applied to the selected word line. Techniques disclosed herein ramp up the selected word line voltage to the program voltage rapidly without resorting to using a large change pump. Techniques disclosed herein may decrease the total amount of time that steps 1004-1008 take to perform.

In step 1010, a verification process is performed. In step 1012, it is determined whether memory cells have verified that their threshold voltages are at the final target voltage for that memory cell. Note that it is not required that every memory cell for a given state is verified to be at the appropriate threshold voltage. Error correction is able to correct for some memory cells being below their target threshold voltage. Error correction is able to correct for some memory cells being over-programmed Step 1012 is referring to all states having completed programming.

If verification passes, the programming process is completed successfully (status=pass) in step 1014. If all of the memory cells are not all verified, then it is determined whether the program counter (PC) is less than a maximum value such as 20. If the program counter (PC) is not less than max (step 1016), then the program process has failed (step 1018). If the program counter (PC) is less than a maximum value (e.g., 20), then the program counter (PC) is incremented by 1 and the program voltage is stepped up to the next value in step 1020. Subsequent to step 1020, the process loops back to step 1004 to prepare for and apply the next program pulse to the selected word line.

Figure 11:
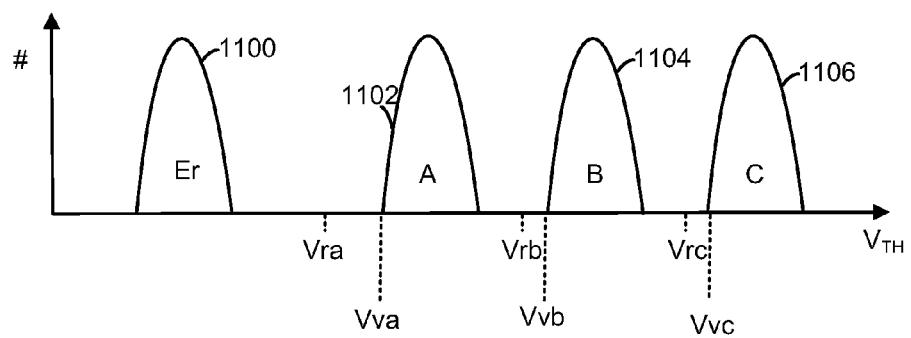
FIG. 11 depicts an example set of threshold voltage distributions for a four-state memory device in which each storage element stores two bits of data.

FIG. 11 depicts an example set of threshold voltage distributions for a four-state memory device in which each storage element stores two bits of data. A first threshold voltage ($V_{TH}$) distribution 1100 is provided for erased (Er-state) storage elements. Three $V_{TH}$ distributions 1102, 1104 and 1106 represent programmed states A, B and C, respectively. In one embodiment, the threshold voltages in the Er-state are negative and the threshold voltages in the A, B and C distributions are positive. However, all or a part of the threshold distribution in the Er-state may be positive. Also, all or a part of the threshold distribution of the A-state may be negative (likewise for other data states).

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

Figure 12A:
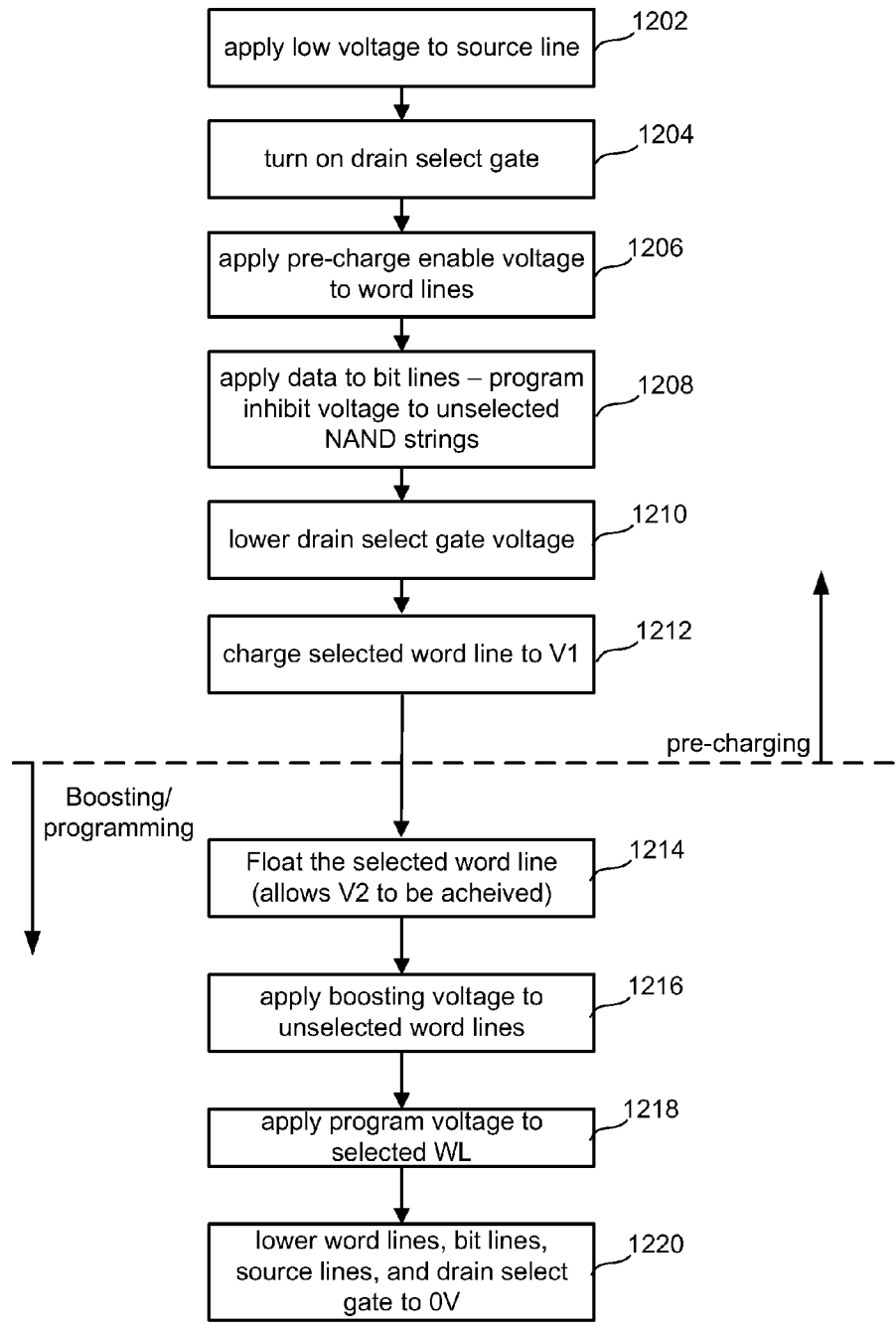
FIG. 12A is a flowchart of one embodiment of programming non-volatile storage.
Figure 13:
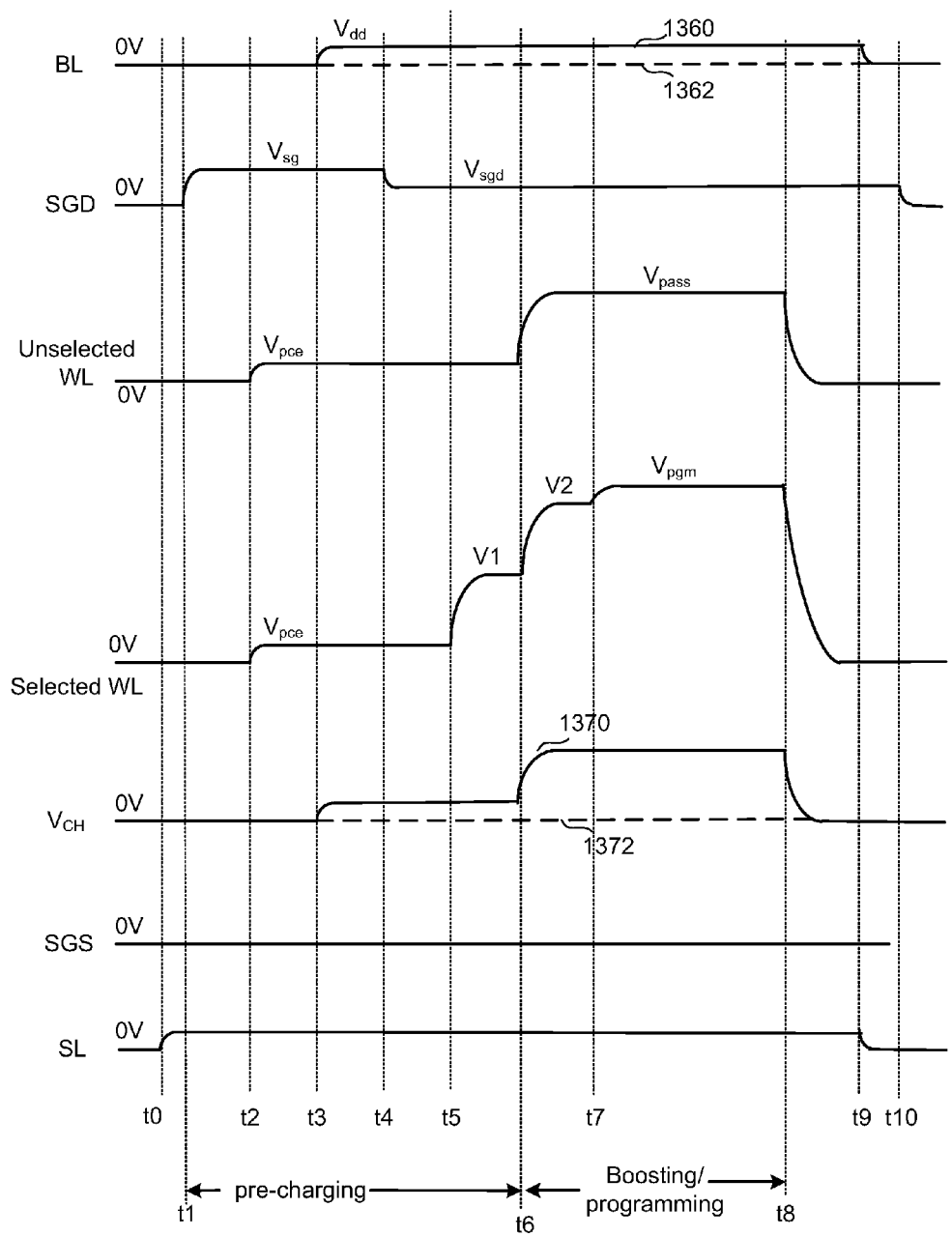
FIG. 13 is a timing diagram depicting various voltage signals that can be applied during a programming process in accordance with one embodiment.

FIG. 12A is a flowchart of one embodiment of programming non-volatile storage. This process is used to program 3D NAND in one embodiment. This process is used to program 2D NAND in one embodiment. Steps 1202 through 1212 correspond to the pre-charge phase (FIG. 10, 1004). Steps 1214 through 1220 correspond to the boosting and programming phase (FIG. 10, steps 1006 and 1008). FIG. 13 shows timing of various signals during one embodiment of the process of FIG. 12A. FIG. 13 will be discussed after first discussing the process of FIG. 12A.

A low voltage on the order of 1.0V-1.5V is applied to the source line at step 1202. The drain select gate is turned on at step 1204, for example, by applying a positive bias of about $V_{SGD}$. At step 1206, a pre-charge enable voltage $V_{PCE}$ is applied to each word line of the NAND string.

At step 1208, the data is applied to the bit lines of each NAND string forming part of the programming process. For example, those NAND strings not to be programmed (inhibited) will have $V_{DD}$ applied to their bit lines while those NAND strings to be programmed will have 0V applied to their bit lines. At step 1210, the drain select gate line voltage is lowered to turn off the drain select gate for the inhibited NAND strings while leaving the enabled NAND strings in communication with their bit line.

Figure 14A:
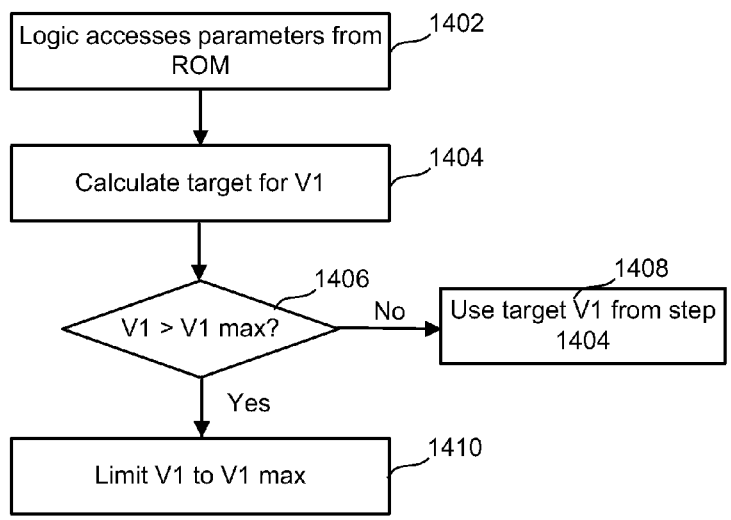
FIG. 14A is a flowchart illustrating a process of determining a suitable magnitude for the first target voltage V1.

At step 1212, the selected word line is charged to a first target voltage (referred to herein as V1). V1 may be larger than the pre-charge enable voltage $V_{PCE}$. In one embodiment, a charge pump 902 is used to provide the voltage to a word line driver 904, which drives the selected word line to the first target voltage. FIG. 14A and its description provide details for one embodiment of determining a suitable value for V1.

Step 1212 concludes the pre-charge phase. The channel region of an inhibited NAND string will be pre-charged in accordance with the bit line voltage to further facilitate program inhibit when the program voltage is later applied.

At step 1214, the selected word line is floated. This step will allow the voltage on the selected word line to couple up to a second target voltage V2.

At step 1216, a boosting voltage (e.g., $V_{PASS}$) is applied to unselected word lines. Note that this ramps the voltage in unselected word lines from $V_{PCE}$ up to $V_{PASS}$. A charge pump 902 may be used to provide $V_{PASS}$ to the unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Note that the floating of the selected word line occurs while the boosting voltage is applied to the unselected word lines. Since the selected word line is floated at this time, the voltage on the selected word line will increase due to capacitive coupling with the adjacent unselected word lines. The selected word line thus has its voltage increase from the first target voltage (V1) to a second target voltage (V2). V2 is typically below the program voltage. If V2 is above the program voltage, this could extend the overall duration of the program pulse. It may be undesirable to extend the overall duration of the program pulse.

The program voltage $V_{PGM}$ is then applied to the selected word line at step 1218. This may include a charge pump 902 providing the program voltage to the selected word line. Because V2 is typically fairly close to the program voltage, the charge pump 902 does not have to ramp up the voltage on the selected word line by a significant amount. However, since V2 is typically below the $V_{PGM}$, the program pulse duration is not extended.

With the boosting voltages applied and the inhibited NAND string pre-charged, programming of targeted memory cells on the selected word line is inhibited. At step 1220, the word lines, bit lines, source lines, and drain select gate lines are lowered to 0V, marking the completion of one programming iteration. It should be noted that the steps of FIG. 12A can be applied with each iteration of the process of FIG. 12A, with the program voltage being increased each iteration. However, it is not required that the program voltage increase in magnitude with each iteration.

Figure 12B:
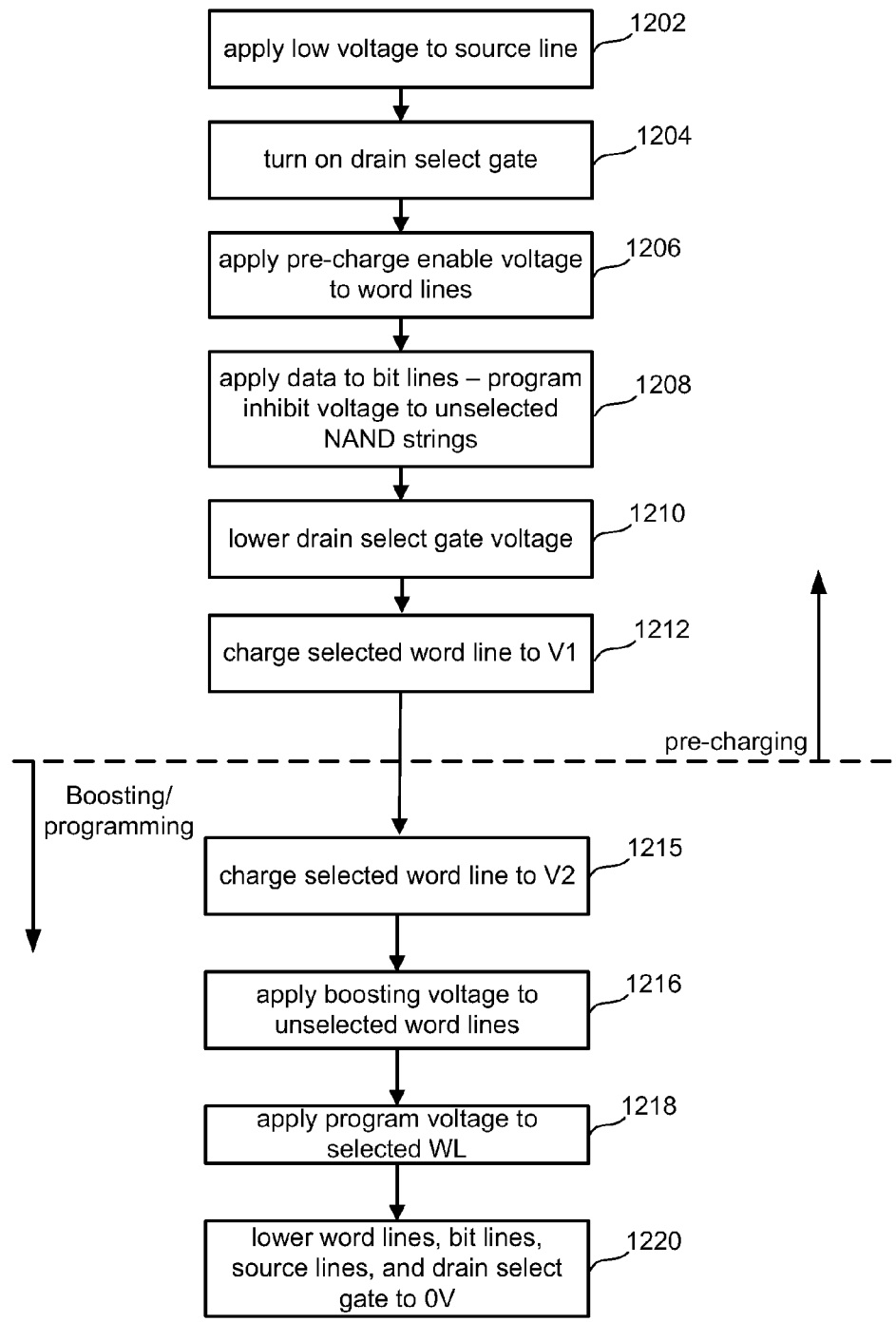
FIG. 12B is one embodiment of an alternative programming process.

FIG. 12B is one embodiment of an alternative programming process. Steps 1202-1212 are similar to FIG. 12A. However, rather than floating the selected word line after step 1212, the selected word line is charged to the second target voltage (V2), in step 1215. The charge pump 902 may be used to charge the selected word line to V2.

Step 1216 (boosting the unselected word lines) may be similar to FIG. 12A. Steps 1215 and 1216 may be performed at the same time, although this is not a requirement. Next, steps 1218-1220 may be performed in a similar manner as FIG. 12A.

FIG. 13 is a timing diagram depicting various voltage signals that can be applied during a programming process in accordance with one embodiment. In one case, the depicted technique can be used during steps 1004-1008 of FIG. 10. In one case, the depicted technique can be used during steps 1202-1220 of FIG. 12A. In one case, the depicted technique can be used during steps 1202-1220 of FIG. 12B.

The timing diagram is divided to illustrate the pre-charge phase and boosting/programming phase of the programming process. [Note that the pre-charge phase and boosting/programming phase do not necessarily form the entire sequence.] The voltage signals illustrated for the pre-charge phase from time t1-t6 can be used at step 1004 of FIG. 10. The voltage signals illustrated for the boosting phase from time t5-t8 can be used at steps 1006-1008 of FIG. 10.

The common source line SL is raised to a low voltage of about 1.0V-1.5V at time t0 where it remains for the duration of the programming process. The source line SL is kept at 0V in some embodiments. The source select gate line SGS remains at 0V to place the source select gates into isolation mode. At time $t_1$, the drain select gate line SGD is raised to $V_{SG}$, which is on the order of about 3.5V-4.5V, in one embodiment. The pre-charge enable voltages are applied to the word lines at time t2. Both the selected word line WL and the unselected word lines receive the pre-charge voltage $V_{PCE}$. In one embodiment, $V_{PCE}$ is equal to 0V, however, other voltages can be used as well. Thus, although the timing diagram depicts $V_{PCE}$ as being greater than 0V, this is for the purpose of explanation. $V_{PCE}$ is not required to be greater than 0V.

At time t3, the data is applied to the bit lines. A first value can be set into a bit line latch for each unselected NAND string and a second value set into the bit line latch for each of the selected NAND strings. Line 1362 shows the bit line voltage at 0V for a NAND string having a cell at the selected word line WLn that is to be programmed. Line 1360 shows the bit line voltage at $V_{DD}$ for a NAND string having a cell at WLn that is to be inhibited from programming $V_{DD}$ designates program inhibit and is often referred to as a program inhibit voltage. It can also be thought of as a pre-charge voltage as this voltage is essentially transferred to the channel region of the inhibited NAND string when a high voltage is applied on SGD. A voltage other than $V_{DD}$ can be used for the pre-charge voltage in other embodiments. A level of the pre-charge voltage, and corresponding level for $V_{SG}$, should be chosen to achieve proper pre-charging within the channel region.

Referring to the period from t3-t4, line 1370 depicts the resulting channel voltage of a NAND string that is inhibited from programming. The channel voltage $V_{CH}$ is pre-charged to a level in accordance with the bit line voltage and voltage applied to the drain select gate line. In this case, $V_{SG}$ is applied to SGD such that the full bit line voltage is transferred to the channel region causing a rise in $V_{CH}$ to $V_{DD}$. Line 1372 depicts the resulting channel voltage $V_{CH}$ of a NAND string that is enabled for programming. 0V is applied to this string's bit line resulting in a channel voltage of 0V. Thus, there is no pre-charging in the enabled NAND string.

At time t4, the drain select gate line SGD is lowered to $V_{SGD}$. The voltage $V_{SGD}$ is lower than $V_{SG}$ in order to turn off the drain select gate in those NAND strings that are to be inhibited from programming. Thus, the channel region of those NAND strings that are to be inhibited from programming are cutoff from the bit line, enabling boosting of those channel regions as hereinafter described. The NAND strings that are to be programmed, having 0V at their bit line, will remain on when the drain side select gate voltage is lowered to $V_{SGD}$. The channel regions remain at 0V and a path is provided to draw electrons to the floating gates of the memory cells when the programming voltage is applied. In one embodiment, the drain select gate line can be raised to $V_{SGD}$ at time t1. The full bit line voltage $V_{DD}$ may not be transferred into the channel in such an embodiment, leading to a lower pre-charge level.

At time t5, the voltage on the selected word line is raised to a first target voltage V1. In one embodiment, a charge pump 902 is used to charge up the selected word line to V1.

At time t6, the pre-charge phase ends and the boosting/programming phase begins. The boosting voltages are applied to the various word lines at time t6. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

In one embodiment, the unselected word lines may receive different pass voltages. For example, in one LSB embodiment, many of the unselected word lines receive a $V_{PASS}$ of, for example, 10V, while one or more receive a voltage less than 10V. In one EASB embodiment, many of the unselected word lines receive a $V_{PASS}$ of, for example, 10 V, while one or more receive a voltage less than 10V. Some unselected word lines could receive a voltage greater than the normal $V_{PASS}$ in one embodiment.

The channel voltage $V_{CH}$ of the inhibited NAND string rises in accordance with the boosting voltage applied to the word lines as shown at 1370. In some implementations, about a 50% coupling ratio between channel and word line can be expected. If a value of 1V is used for $V_{PCE}$ and a value of 10V is used for $V_{PASS}$, the word line voltages are increased about 9V when $V_{PASS}$ is applied. Accordingly, the channel voltage of the inhibited NAND string can be expected to rise about 4.5V. Since the channel region was pre-charged to about $V_{DD}$, the channel voltage $V_{CH}$ can be expected to rise to at least 5.5V. For the NAND string enabled for programming, the channel region remains at 0V as shown at 1372 because the drain select gate is on and 0V is applied to the bit line.

Also, at time t6, the selected word line has its voltage raised from the first target voltage V1 to the second target voltage V2. In one embodiment, the selected word line is floated at time t6. This allows the voltage on the selected word line to be coupled up from V1 to V2 due to capacitive coupling with its neighbor unselected word lines. In one embodiment, the selected word line is charged up to V2 by the charge pump 902 rather than floating the selected word line.

At time t7, the program voltage $V_{PGM}$ is applied to the selected word line WLn. In one embodiment, charge pump 902 supplies the program voltage $V_{PGM}$ to the selected word line. Note that the selected word line only needs to go from V2 to $V_{PGM}$. This can be achieved quickly without a large charge pump 902. That is to say, V2 can be made relatively close to $V_{PGM}$ such that a large charge pump is not required.

Because the inhibited NAND string channel is boosted when the program voltage is applied, the unselected memory cells at WLn for the inhibited NAND strings will not be programmed. The boosted channel region voltage decreases the potential across those memory cells' tunnel oxide regions, thus preventing any inadvertent programming.

At time t8, the word lines are lowered to 0V. The source and bit lines are then lowered to 0V at time t9. The drain select gate line SGD is lowered to 0V at time t10. Numerous variations to the signals depicted in FIG. 13 can be made in accordance with embodiments.

FIG. 14A is a flowchart illustrating a process of determining a suitable magnitude for the first target voltage V1. Recall that this voltage may be applied at time t5 in FIG. 13. This process is performed by control logic on the memory device in one embodiment. For example, controller 944, as well as other circuits, such as limiter 906, could perform this process. In one embodiment, the controller 944 accesses parameters from ROM 908 to calculate a suitable V1. In another embodiment, the parameters to calculate V1 (or possible the value for V1) are provided to the memory device from an external source. For example, a host device to which the memory device is connected may provide the value of V1 to the controller 944 on the chip. The process of FIG. 14A will be described as being performed by logic on the memory device. It will be understood that the process can be modified to be performed in part or in whole external to the memory device.

In step 1402, the control logic (e.g., one or more managing circuits) on the memory device accesses parameters for determining V1 from non-volatile storage. In one embodiment, the controller 944 accesses parameters form the ROM 908. The ROM 908 on the memory device contains various device parameters. This ROM 908 can be written when the memory device is manufactured.

One factor in the determination of a suitable V1 is to prevent (or substantially reduce) program disturb from happening.

Another factor in the determination of a suitable V1 is the magnitude of the second target voltage V2. Note that in some embodiments, the magnitude of V1 has an impact on the magnitude of V2. This may be the case for embodiments in which the selected word line is coupled up to V2 based on capacitive coupling with the unselected word lines.

In step 1404, the control logic calculates a target for V1. In one embodiment, Equation 1 is used to determine V1.

$$V1 = V_{PGM} - V_{STEP} - C_R * (V_{PASS} - V_{PCE})  \qquad \text{Eq. 1}$$

In Equation 1, $V_{PGM}$ is the target program voltage and $V_{STEP}$ is the desired step up from V2 to $V_{PGM}$. As discussed above, the value for $V_{PGM}$ may increase during programming with each program loop. Therefore, this may be a variable that depends on which program loop is being performed. As noted, $V_{STEP}$ is the desired step up from V2 to $V_{PGM}$. $V_{STEP}$ is the size of the increment in $V_{PGM}$ from one program loop to the next, in one embodiment. However, $V_{STEP}$ could be smaller or larger. In effect, $V_{STEP}$ is a target voltage gap between V2 and $V_{PGM}$.

$C_R$ refers to the capacitive coupling ratio between the selected word line and neighboring (e.g., adjacent) unselected word line(s). $V_{PASS}$ is the boosting voltage that is applied to the neighboring unselected word line(s). $V_{PCE}$ is the voltage that is applied to the neighboring unselected word line(s) during the channel pre-charge phase. Thus, note that $V_{PASS}-V_{PCE}$ represents the increase of voltage on the unselected word lines just after t6, in the embodiment of FIG. 13. Assuming that the selected word line is floating at this time, the voltage one the selected word line will increase due to capacitive coupling with the adjacent unselected word lines, in one embodiment.

In one embodiment, $C_R$ is the maximum expected coupling ratio between the selected and unselected word lines, given factors such as process variation and operating conditions. In one embodiment, the control logic determines $C_R$ based on information in the ROM 908. $C_R$ may change according to the program operation. The reasons of the change include the number of active planes and location of the selected word line. For example, if the selected word line is at the end of the NAND string it may have only one directly adjacent unselected word line. On the other hand, some selected word lines may have two directly adjacent unselected word lines. Also, a greater number of active planes in a 3D device can result in a greater $C_R$. As one example, the number of active planes might vary between one plane and four planes.

Also information of process variation may be used to calculate $C_R$. As one example, the parasitic capacitance could be calculated with assumptions of a certain amount (e.g., 10%) process variation in each dimension. The process variation includes WL-WL capacitance and capacitance between CG wires that carry $V_{PGM}$ and adjacent wires. The WL-WL parasitic capacitance is represented in FIG. 9B by the capacitors in the memory array 900. The capacitance between CG wires is represented by the capacitor outside the memory array 900 between line CG and the adjacent wire. Such information may also be recorded in the ROM 908. If the variable values are unknown, estimated value that maximize $C_R$ may be used to prevent an overly high V2.

If there is a neighbor unselected word line on each side of the selected word line, the value for $V_{PASS}$ may be the same for both neighbors, of may be different for the two neighbors.

Referring back to Equation 1, in one embodiment, the control logic determines V1 based on a difference between the program voltage and the coupling ratio between the selected word line and one or more adjacent unselected word lines. In one embodiment, the control logic determines V1 based on a difference between the program voltage and a product of the coupling ratio times the difference between the boosting voltage ($V_{PASS}$) and $V_{PCE}$. Note that the coupling ratio could be a maximum expected coupling ratio, but that is not required.

In step 1406, the control logic compares V1 to a maximum allowable V1. As noted above, the magnitude of V1 should not be too great or program disturb could occur. In one embodiment, Equation 2 is used by the control logic to determine whether the target value for V1 is too great.

$$V1 > V_{CH\_MIN} + V_{DIST} \qquad \text{Eq. 2:}$$

In Equation 2, $V_{CH\_MIN}$ is the minimum expected voltage in the channel of unselected NAND strings during the pre-charge phase. The value for $V_{CH\_MIN}$ can vary depending on the data that has already been programmed into memory cells. For example, in some embodiments, the NAND string is programmed from the source end to the drain end. Thus, when a memory cell in the middle of the NAND string is being programmed, other memory cells towards the source end have already been programmed. These memory cells could potentially have been programmed to different data states. Hence the charge on their floating gates could vary, depending on the data pattern that has been already been programmed. The foregoing can impact the value for $V_{CH\_MIN}$. In one embodiment, a value for $V_{CH\_MIN}$ is stored into non-volatile storage (e.g., ROM 908) on the memory device.

Figure 14B:
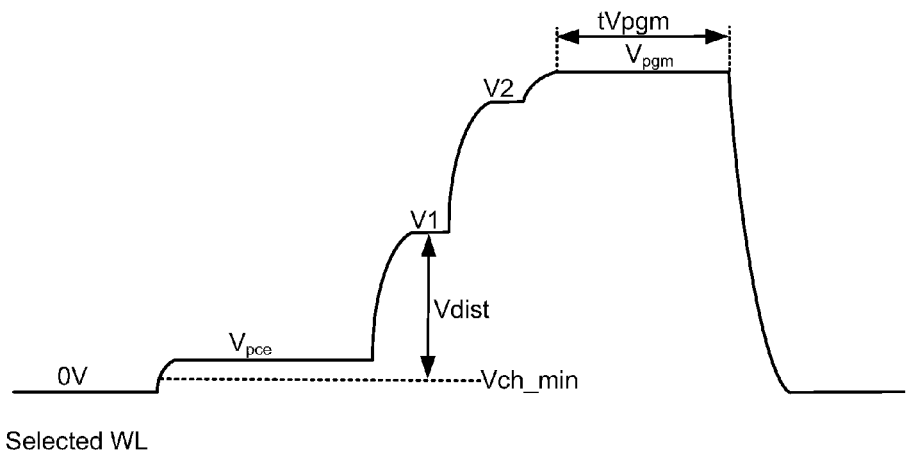
FIG. 14B is a diagram of voltages applied to the selected word line during one embodiment of programming.

In Equation 2, $V_{DIST}$ is a maximum acceptable voltage between the NAND channel and the selected word line factoring in program disturb. For example, $V_{DIST}$ may be a maximum acceptable voltage with a tolerable amount of program disturb, with no program disturb, etc. In one embodiment, a value for $V_{DIST}$ is stored into non-volatile storage (e.g., ROM 908) on the memory device. FIG. 14B is a diagram of voltages applied to the selected word line during one embodiment of programming. FIG. 14B also depicts an example of $V_{CH\_MIN}$ and $V_{DIST}$.

Referring back to Equation 2, in one embodiment, to calculate V1, the control logic accesses a first parameter that specifies a minimum expected voltage of channels during the pre-charge phase (e.g., $V_{CH\_MIN}$), accesses a second parameter that specifies a maximum acceptable voltage between the selected word line and the channels of the NAND strings during the pre-charge phase to keep program disturb within a design tolerance (e.g., $V_{DIST}$), and limits V1 to no more than the difference between the minimum expected voltage of channels during the pre-charge phase and the maximum acceptable voltage.

In one embodiment, the control logic determines a suitable V1 based on Equation 2, but does not use Equation 1. For example, if the selected word line is being charged from V1 to V2 (as opposed to floated and capacitively coupled up), then Equation 1 is not used in one embodiment.

Equation 3 is one example of calculating a maximum acceptable $V_{DIST}$. This may result in a disturb that is comparable to program disturb that may otherwise occur.

$$V_{DIST} = V_{PGM} - V_{CH\_PGM} + [-\log(tV1) - \log(Npul/w1) + \log(tV_{PGM})]/0.8 \qquad \text{Eq. 3}$$

In Equation 3, tV1 is the duration of V1 on the selected word line, Npu1/w1 is the number of pulses of V1 per word line, $tV_{PGM}$ is the program pulse duration, $V_{CHPGM}$ is the inhibit channel voltage during the program pulse ($V_{PGM}$). Line 1370 in FIG. 13 shows one example of the inhibit channel voltage during the program pulse. Note that other techniques may be used to calculate $V_{DIST}$.

If the control logic determines that the target V1 is greater than $V_{CH\_MIN} + V_{DIST}$, then V1 is limited to $V_{CH\_MIN+VDIST}$, in one embodiment. An Equation other than Equation 2 could be used to limit V1. FIG. 9B depicts limiter 906 sampling the output of the charge pump 902 and providing a feedback signal. This is one way of limiting the voltage V1. However, other techniques could be used. Another technique is for the control circuitry 920 to instruct the charge pump 902 what voltage to produce, such that the charge pump 902 does not output too large of a V1.

If the target for V1 is not greater than $V_{CH\_MIN} + V_{DIST}$, then in step 1408 V1 is established as the target value calculated in step 1404. Otherwise, V1 is limited to V1 max in step 1410. Note that limiting V1 to a value that is less than the target calculated in step 1404 could result in the voltage on the unselected word line not fully reaching V2, in embodiments that float the unselected word line.

Referring again to FIG. 14B, the programming time can be defined as the length of time for which the voltage on the selected word line is at $V_{PGM}$. This is represented by $tV_{PGM}$. Embodiments prevent the programming time from being excessive by preventing V2 from being too high. For example, if V2 were allowed to be as great or greater than $V_{PGM}$, then the programming time $tV_{PGM}$ could be larger than desired. As noted above, in some embodiments, V2 is targeted to be $V_{STEP}$ below $V_{PGM}$. $V_{STEP}$ can be the same as the step up in programming voltage from one program pulse to the next.

One embodiment includes a method of operating non-volatile storage comprising the following. A first voltage is applied to unselected word lines during a channel pre-charge phase. A second voltage that is greater than the first voltage is applied to a selected word line during the channel pre-charge phase. The first voltage on the unselected word lines in increased to a boosting voltage. The second voltage on the selected word is increased to a third voltage that is greater than the boosting voltage. The third voltage is increased to a program voltage on the selected word line while maintaining the boosting voltage on the unselected word lines.

One embodiment includes a non-volatile storage device comprising a plurality of NAND strings of non-volatile storage elements, a plurality of bit lines associated with the plurality of NAND strings, a plurality of word lines associated with the plurality of NAND strings, and one or more managing circuits in communication with the plurality of bit lines and the plurality of word lines. The one or more managing circuits apply a first voltage to unselected word lines during a channel pre-charge phase. The one or more managing circuits apply a second voltage that is greater than the first voltage to a selected word line during the channel pre-charge phase. The one or more managing circuits increase the first voltage on the unselected word lines to a boosting voltage. The one or more managing circuits increase the second voltage on the selected word to a third voltage that is greater than the boosting voltage. The one or more managing circuits increase the third voltage to a program voltage on the selected word line while maintaining the boosting voltage on the unselected word lines.

A method of operating non-volatile storage comprising a plurality of NAND strings having channels. The method comprises the following. The channels of the plurality of NAND strings are pre-charged, including applying a pre-charge voltage to a selected word line and unselected word lines associated with the plurality of NAND strings. An inhibit voltage is applied to bit lines associated with unselected NAND strings of the plurality of NAND strings after pre-charging the channels. A program enable voltage is applied to bit lines associated with selected NAND strings of the plurality of NAND strings after pre-charging the channels. A voltage on the selected word line is increased from the pre-charge voltage to a first target voltage after applying the inhibit voltage and the program voltage to the bit lines and while maintaining the pre-charge voltage on the unselected word lines. The pre-charge voltage on the unselected word lines is increased to a boosting voltage while increasing the first target voltage on the selected word line to a second target voltage during a channel boosting phase. A program voltage is applied to the selected word line after the second target voltage has been achieved on the selected word line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A three-dimensional memory device, comprising:
a substrate;
a plurality of sets of non-volatile storage elements formed above the substrate in multiple physical levels of a three-dimensional memory array, each of the sets having an active area comprising a channel that extends vertically through the physical levels;
a plurality of bit lines associated with the plurality of sets of non-volatile storage elements;
a plurality of word lines associated with the plurality of sets of non-volatile storage elements; and
a circuitry in communication with the plurality of sets of non-volatile storage elements, the plurality of bit lines and the plurality of word lines, the circuitry applies a first voltage to unselected word lines during a channel pre-charge phase of a programming operation, the circuitry applies a second voltage that is greater than the first voltage to a selected word line during the channel pre-charge phase, the circuitry increases the first voltage on the unselected word lines to a boosting voltage during a boosting/programming phase of the programming operation, the circuitry increases the second voltage on the selected word line to a third voltage that is greater than the boosting voltage during the boosting/programming phase, the circuitry increases the third voltage to a program voltage on the selected word line while maintaining the boosting voltage on the unselected word lines during the boosting/programming phase.

2. The three-dimensional memory device of claim 1, wherein the circuitry pre-charges the channels of unselected sets of the plurality of sets of non-volatile storage elements during the channel pre-charge phase, the circuitry applies a program inhibit voltage to bit lines of the plurality of bit lines associated with the unselected sets during the channel pre-charge phase, the circuitry applies a program enable voltage to bit lines of the plurality of bit lines associated with selected sets of the plurality of sets of non-volatile storage elements during the channel pre-charge phase, the circuitry applies the second voltage to the selected word line after applying the program inhibit voltage and the program enable voltage.

3. The three-dimensional memory device of claim 2, wherein the plurality of sets of non-volatile storage elements further comprise a drain side select gate, the bit lines are coupled to the respective drain side select gates, the circuitry turns on the drain side select gates prior to applying the program inhibit voltages and the program enable voltages, the circuitry turns off the drain side select gates for the unselected sets of non-volatile storage elements while leaving on the drain side select gates of selected sets of non-volatile storage elements after applying the program inhibit voltages and the program enable voltages and prior to applying the second voltage to the selected word line.

4. The three-dimensional memory device of claim 1, wherein:
the plurality of sets of non-volatile storage elements comprise vertically oriented NAND strings.

5. The three-dimensional memory device of claim 1, wherein the circuitry determines the second voltage based on:

$$V_{PGM} - C_R * (V_{PASS} - V_{PCE}),$$

where $V_{PGM}$ is the program voltage, $C_R$ is a coupling ratio between the selected word line and one or more adjacent unselected word lines, $V_{PASS}$ is the boosting voltage, and $V_{PCE}$ is the first voltage, the circuitry floats the selected word line while charging the unselected word lines from the first voltage to the boosting voltage to achieve the third voltage on the selected word line.

6. The three-dimensional memory device of claim 5, wherein the circuitry determines the second voltage based on a target voltage gap between the third voltage and the program voltage.

7. The three-dimensional memory device of claim 1, wherein the circuitry accesses a first parameter that specifies a minimum expected voltage of the channels during the pre-charge phase, accesses a second parameter that specifies a maximum acceptable voltage between the selected word line and the channels during the pre-charge phase to keep program disturb within a design tolerance, and limits the second voltage to no more than the difference between the minimum expected voltage of the channels during the pre-charge phase and the maximum acceptable voltage.

8. The three-dimensional memory device of claim 1, wherein the circuitry charges the selected word line from the third voltage to the program voltage.

9. A method of operating a three-dimensional memory device comprising a plurality of sets of memory cells formed above a substrate in multiple physical levels, a plurality of word lines associated with the plurality of sets of memory cells, and circuitry associated with operation of the plurality of sets of memory cells, each of the sets of memory cells having an active area comprising a channel that extends vertically through the physical levels, the method comprising:
applying a first voltage to unselected word lines of the plurality of word lines during a channel pre-charge phase of a programming operation;
applying a second voltage that is greater than the first voltage to a selected word line of the plurality of word lines during the channel pre-charge phase;
increasing the first voltage on the unselected word lines to a boosting voltage during a boosting/programming phase of the programming operation;
increasing the second voltage on the selected word line to a third voltage that is greater than the boosting voltage during the boosting/programming phase; and
increasing the third voltage to a program voltage on the selected word line while maintaining the boosting voltage on the unselected word lines.

10. The method of claim 9, further comprising:
determining, by the circuitry, the second voltage based on the program voltage.

11. The method of claim 10, wherein the determining the second voltage is based on a target voltage gap between the third voltage and the program voltage.

12. The method of claim 9, further comprising determining the second voltage based on a difference between the program voltage and a coupling ratio between the selected word line and an adjacent unselected word line, the determining is performed by the circuitry.

13. The method of claim 12, wherein the determining the second voltage is based on a difference between the program voltage and a product of the coupling ratio times the difference between the boosting voltage and the first voltage.

14. The method of claim 13, wherein the increasing the first voltage on the unselected word lines to a boosting voltage and the increasing the second voltage on the selected word to a third voltage that is greater than the boosting voltage comprises:
floating the selected word line while charging the unselected word lines up to the boosting voltage.

15. The method of claim 9, wherein the sets of memory cells comprise NAND strings of non-volatile storage elements, the boosting voltage boosts voltages of the channels of the unselected NAND strings, and further comprising:
pre-charging the channels of unselected NAND strings during the channel pre-charge phase;
accessing a first parameter that specifies a minimum expected voltage of channels during the pre-charge phase;
accessing a second parameter that specifies a maximum acceptable voltage between the selected word line and the channels of the NAND strings during the pre-charge phase to keep program disturb within a design tolerance; and
limiting the second voltage to no more than the difference between the minimum expected voltage of channels during the pre-charge phase and the maximum acceptable voltage.

16. The method of claim 9, wherein the increasing the third voltage to a program voltage on the selected word line while maintaining the boosting voltage on the unselected word lines comprises:
charging the selected word line from the third voltage to the program voltage.

17. A three-dimensional memory device, comprising:
a substrate;
a plurality of NAND strings of non-volatile storage elements formed above the substrate in multiple physical levels of a three-dimensional memory array, each of the NAND strings having an active area comprising a channel that extends vertically through the physical levels;
a plurality of bit lines associated with the plurality of NAND strings;
a plurality of word lines associated with the plurality of NAND strings; and
a circuitry coupled to the plurality of NAND strings, the plurality of bit lines and the plurality of word lines, the circuitry pre-charges the channels of unselected NAND strings of the plurality of NAND strings during a programming operation, when pre-charging the channels the circuitry applies a pre-charge voltage to a selected word line and to unselected word lines associated with the plurality of NAND strings, applies a program inhibit voltage to unselected bit lines associated with the unselected NAND strings, and applies a program enable voltage to selected bit lines associated with selected NAND strings of the plurality of NAND strings, the circuitry increases a voltage on the selected word line from the pre-charge voltage to a first target voltage after the circuitry pre-charges the channels of the unselected NAND strings, the circuitry increases the pre-charge voltage on the unselected word lines to a boosting voltage while increasing the first target voltage on the selected word line to a second target voltage during a channel boosting phase of the programming operation, the circuitry applies a program voltage to the selected word line after the second target voltage has been achieved on the selected word line.

18. The three-dimensional memory device of claim 17, wherein the circuitry:
determines the first target voltage based on a difference between the program voltage and a desired target gap between the program voltage and the second target voltage.

19. The three-dimensional memory device of claim 18, wherein the circuitry determines the first target voltage based on:

$$V_{PGM} - V_{STEP} - C_R^*(V_{PASS} - V_{PCE}),$$

where $V_{PGM}$ is the program voltage, $V_{STEP}$ is the desired target gap, $C_R$ is a coupling ratio between the selected word line and one or more adjacent unselected word lines, $V_{PASS}$ is the boosting voltage, and $V_{PCE}$ is the pre-charge voltage, wherein when the circuitry increases the voltage on the selected word line from the pre-charge voltage to the first target voltage the circuitry floats the selected word line while charging the unselected word lines from the pre-charge voltage to the boosting voltage.

20. The three-dimensional memory device of claim 17, wherein the circuitry:

determines the first target voltage based on a difference between a minimum expected voltage of NAND channels when pre-charging the channels and a maximum acceptable voltage when pre-charging the channels to keep program disturb within a design tolerance.

* * * * *